United States Patent
Eroz et al.

(10) Patent No.: US 9,246,634 B2
(45) Date of Patent: *Jan. 26, 2016

(54) APPARATUS AND METHOD FOR IMPROVED MODULATION AND CODING SCHEMES FOR BROADBAND SATELLITE COMMUNICATIONS SYSTEMS

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Network Systems, LLC, Germantown, MD (US)

(*) Notice: Subject to any disclaimer, the term of this patent is extended or adjusted under 35 U.S.C. 154(b) by 196 days.

This patent is subject to a terminal disclaimer.

(21) Appl. No.: 13/890,643

(22) Filed: May 9, 2013

(65) Prior Publication Data

US 2014/0229801 A1    Aug. 14, 2014

Related U.S. Application Data

(63) Continuation-in-part of application No. 13/763,723, filed on Feb. 10, 2013, now Pat. No. 8,887,024.

(51) Int. Cl.
*H03M 13/00* (2006.01)
*H04L 1/00* (2006.01)
*H03M 13/11* (2006.01)
*H03M 13/25* (2006.01)
*H03M 13/27* (2006.01)
(Continued)

(52) U.S. Cl.
CPC .......... *H04L 1/0057* (2013.01); *H03M 13/1165* (2013.01); *H03M 13/255* (2013.01); *H03M 13/271* (2013.01); *H03M 13/2906* (2013.01); *H04L 1/00* (2013.01); *H03M 13/152* (2013.01)

(58) Field of Classification Search
USPC .......................................................... 714/776
See application file for complete search history.

(56) References Cited

U.S. PATENT DOCUMENTS 5,805,642 A    9/1998 Wei et al.
5,838,728 A    11/1998 Alamouti et al.
(Continued)

FOREIGN PATENT DOCUMENTS

| EP | WO 2004/006442 A1 | 1/2004 |
| EP | 1387496 A2 | 2/2004 |
| EP | 2365639 A2 | 9/2011 |

OTHER PUBLICATIONS

Author: Mustafa Eroz and Lin-Nan Lee; Title: Structured Low-Density Parity-Check Code Design for Next Generation Digital Video Broadcast; Pub: Military Communications Conference, 2005. MILCOM 2005. IEEE; Date of Conference: Oct. 17-20, 2005; pp. 2461-2466 vol. 4.*

(Continued)

*Primary Examiner* — April Y Blair
*Assistant Examiner* — Thien D Nguyen
(74) *Attorney, Agent, or Firm* — Potomac Technology Law, LLC

(57) ABSTRACT

Modulation and coding schemes are provided for improved performance of wireless communications systems to support services and applications for terminals with operational requirements at relatively low $E_s/N_0$ ratios. The new modulation and coding schemes provide new BCH codes, low density parity check (LDPC) codes and interleaving methods.

22 Claims, 11 Drawing Sheets

(51) Int. Cl.
*H03M 13/29* (2006.01)
*H03M 13/15* (2006.01)

(56) References Cited

U.S. PATENT DOCUMENTS

| | | | |
|---|---|---|---|
| 5,844,943 | A | 12/1998 | Kazecki et al. |
| 5,903,609 | A | 5/1999 | Kool et al. |
| 6,023,783 | A | 2/2000 | Divsalar et al. |
| 6,097,764 | A | 8/2000 | McCallister et al. |
| 6,104,761 | A | 8/2000 | McCallister et al. |
| 6,157,621 | A | 12/2000 | Brown et al. |
| 6,430,722 | B1 | 8/2002 | Eroz et al. |
| 6,529,495 | B1 | 3/2003 | Aazhang et al. |
| 6,674,811 | B1 | 1/2004 | Desrosiers et al. |
| 6,724,813 | B1 | 4/2004 | Jamal et al. |
| 6,829,308 | B2 | 12/2004 | Eroz et al. |
| 6,940,827 | B2 | 9/2005 | Li et al. |
| 6,963,622 | B2 | 11/2005 | Eroz et al. |
| 7,020,829 | B2 | 3/2006 | Eroz et al. |
| 7,039,126 | B2 | 5/2006 | Galins |
| 7,173,978 | B2 | 2/2007 | Zhang et al. |
| 7,187,728 | B2 | 3/2007 | Seier et al. |
| 7,191,378 | B2 * | 3/2007 | Eroz et al. .................. 714/758 |
| 7,203,887 | B2 | 4/2007 | Eroz et al. |
| 7,234,098 | B2 | 6/2007 | Eroz et al. |
| 7,237,174 | B2 | 6/2007 | Eroz et al. |
| 7,296,208 | B2 | 11/2007 | Sun et al. |
| 7,324,613 | B2 | 1/2008 | Fang et al. |
| 7,334,181 | B2 | 2/2008 | Eroz et al. |
| 7,376,883 | B2 | 5/2008 | Eroz et al. |
| 7,398,455 | B2 | 7/2008 | Eroz et al. |
| 7,424,662 | B2 | 9/2008 | Eroz et al. |
| 7,430,396 | B2 | 9/2008 | Sun et al. |
| 7,447,984 | B2 | 11/2008 | Cameron et al. |
| 7,461,325 | B2 | 12/2008 | Eroz et al. |
| 7,483,496 | B2 | 1/2009 | Eroz et al. |
| 7,577,207 | B2 | 8/2009 | Eroz et al. |
| 7,673,226 | B2 | 3/2010 | Eroz et al. |
| 7,725,802 | B2 | 5/2010 | Eroz et al. |
| 7,746,758 | B2 | 6/2010 | Stolpman |
| 7,770,089 | B2 | 8/2010 | Eroz et al. |
| 7,856,586 | B2 | 12/2010 | Eroz et al. |
| 7,864,869 | B2 | 1/2011 | Eroz et al. |
| 7,954,036 | B2 | 5/2011 | Eroz et al. |
| 7,962,830 | B2 | 6/2011 | Eroz et al. |
| 8,028,224 | B2 | 9/2011 | Eroz et al. |
| 8,069,393 | B2 | 11/2011 | Eroz et al. |
| 8,095,854 | B2 | 1/2012 | Eroz et al. |
| 8,102,947 | B2 | 1/2012 | Eroz et al. |
| 8,126,076 | B2 | 2/2012 | Sartori et al. |
| 8,140,931 | B2 | 3/2012 | Eroz et al. |
| 8,144,801 | B2 | 3/2012 | Eroz et al. |
| 8,145,980 | B2 | 3/2012 | Eroz et al. |
| 8,156,400 | B1 | 4/2012 | Yeo et al. |
| 8,181,085 | B2 | 5/2012 | Eroz et al. |
| 8,291,293 | B2 | 10/2012 | Eroz et al. |
| 8,369,448 | B2 | 2/2013 | Zhang et al. |
| 8,392,786 | B2 | 3/2013 | Trachewsky et al. |
| 8,402,341 | B2 | 3/2013 | Eroz et al. |
| 8,782,499 | B2 | 7/2014 | Jeong et al. |
| 8,837,618 | B2 * | 9/2014 | Petrov .................. 375/261 |
| 2003/0002593 | A1 | 1/2003 | Galins |
| 2003/0021358 | A1 | 1/2003 | Galins |
| 2003/0037298 | A1 | 2/2003 | Eleftheriou et al. |
| 2004/0019845 | A1 | 1/2004 | Eroz et al. |
| 2004/0054960 | A1 | 3/2004 | Eroz et al. |
| 2004/0258177 | A1 | 12/2004 | Shen et al. |
| 2005/0111590 | A1 | 5/2005 | Fang et al. |
| 2006/0218459 | A1 | 9/2006 | Hedberg |
| 2006/0224935 | A1 | 10/2006 | Cameron et al. |
| 2008/0019263 | A1 | 1/2008 | Stolpman |
| 2008/0313523 | A1 | 12/2008 | Sun et al. |
| 2009/0158129 | A1 | 6/2009 | Myung et al. |
| 2009/0187804 | A1 | 7/2009 | Shen et al. |
| 2009/0219849 | A1 | 9/2009 | Alpert et al. |
| 2010/0100789 | A1 | 4/2010 | Yu et al. |
| 2010/0122143 | A1 | 5/2010 | Lee et al. |
| 2010/0211841 | A1 | 8/2010 | Cao et al. |
| 2011/0051825 | A1 | 3/2011 | Tao et al. |
| 2011/0164705 | A1 | 7/2011 | Zhang et al. |
| 2011/0202820 | A1 | 8/2011 | Eroz et al. |
| 2011/0239086 | A1 | 9/2011 | Eroz et al. |
| 2013/0198581 | A1 | 8/2013 | Lee et al. |
| 2013/0283131 | A1 | 10/2013 | Tsatsaragkos et al. |
| 2013/0311850 | A1 * | 11/2013 | Shinohara et al. ............ 714/758 |
| 2014/0068375 | A1 | 3/2014 | Eroz et al. |
| 2014/0281797 | A1 * | 9/2014 | Kharkunou .................. 714/758 |

OTHER PUBLICATIONS

Eroz, Mustafa et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, Jan. 1, 2006, 13-17.

Eroz, Mustafa et al., "Structured Low-Density Parity-Check Code Design for Next Generation Digital Video Broadcast", Military Communications Conference, 2005, Oct. 17, 2005, XP010901536, Oct. 17, 2005, 1-6.

ESR P1064EP00, , "European Search Report", EP 2365639 A3, Aug. 1, 2012.

ETSI EN 302 307 V1.2.1 (DVB), , "ETSI EN 302 307 V1.2.1 Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 1, 2009, XP002678089, Aug. 1, 2009, 22-28, 37-49.

* cited by examiner

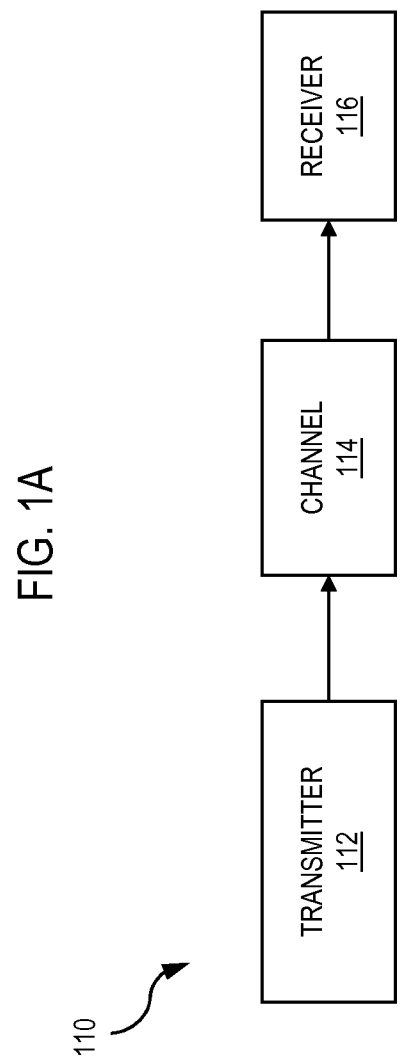

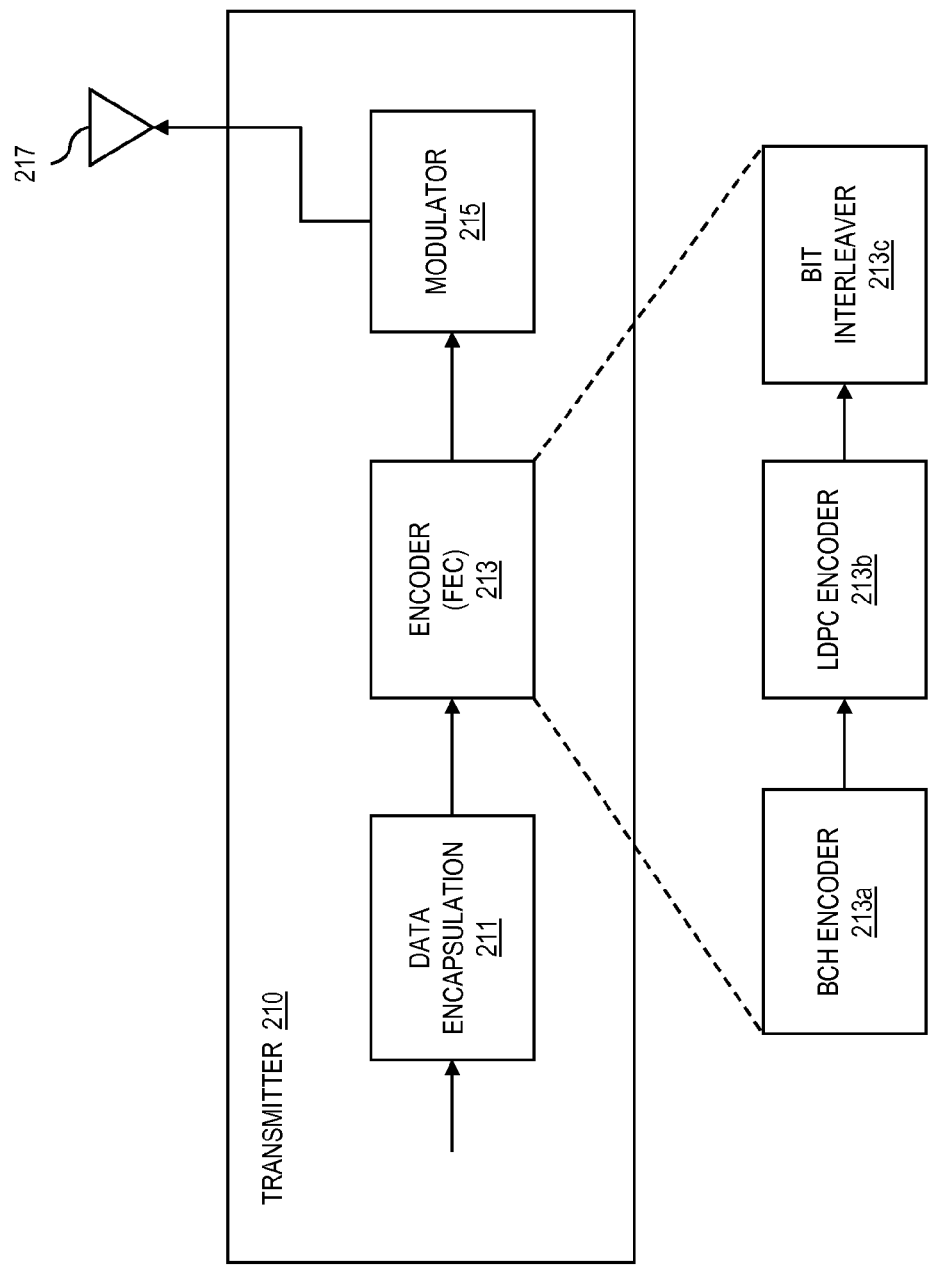

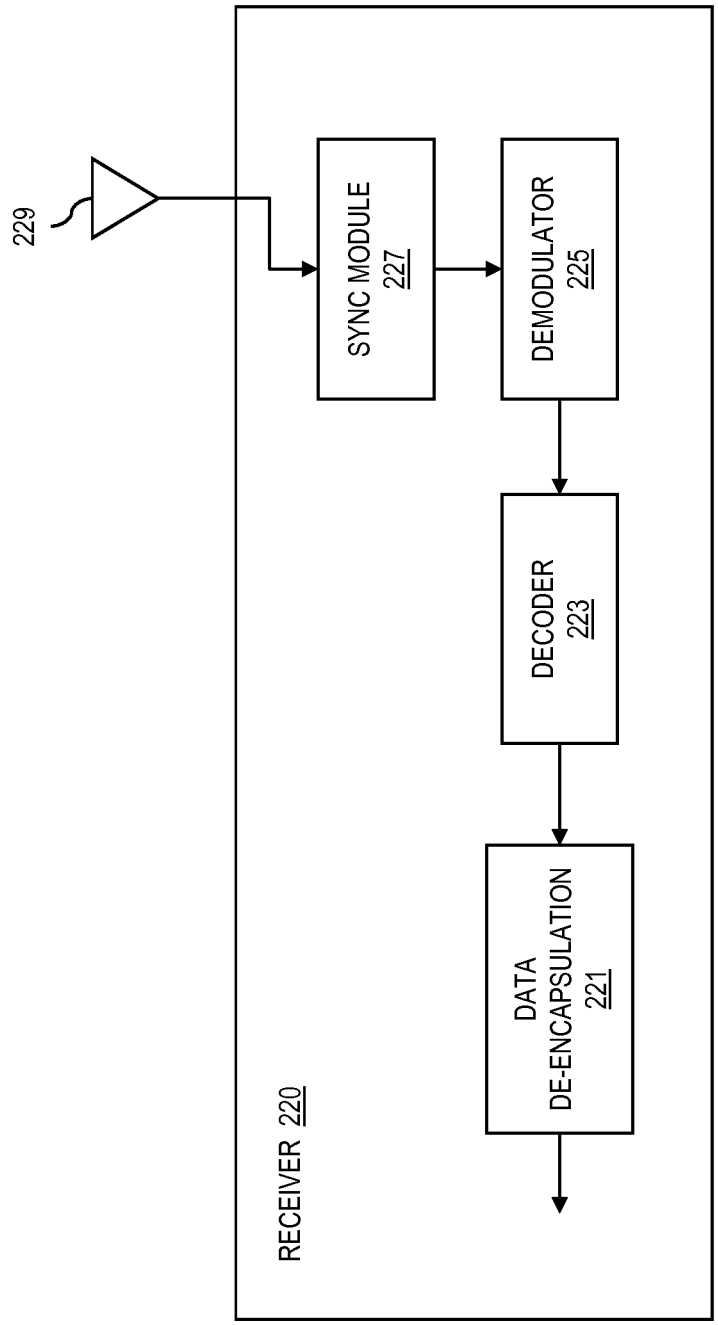

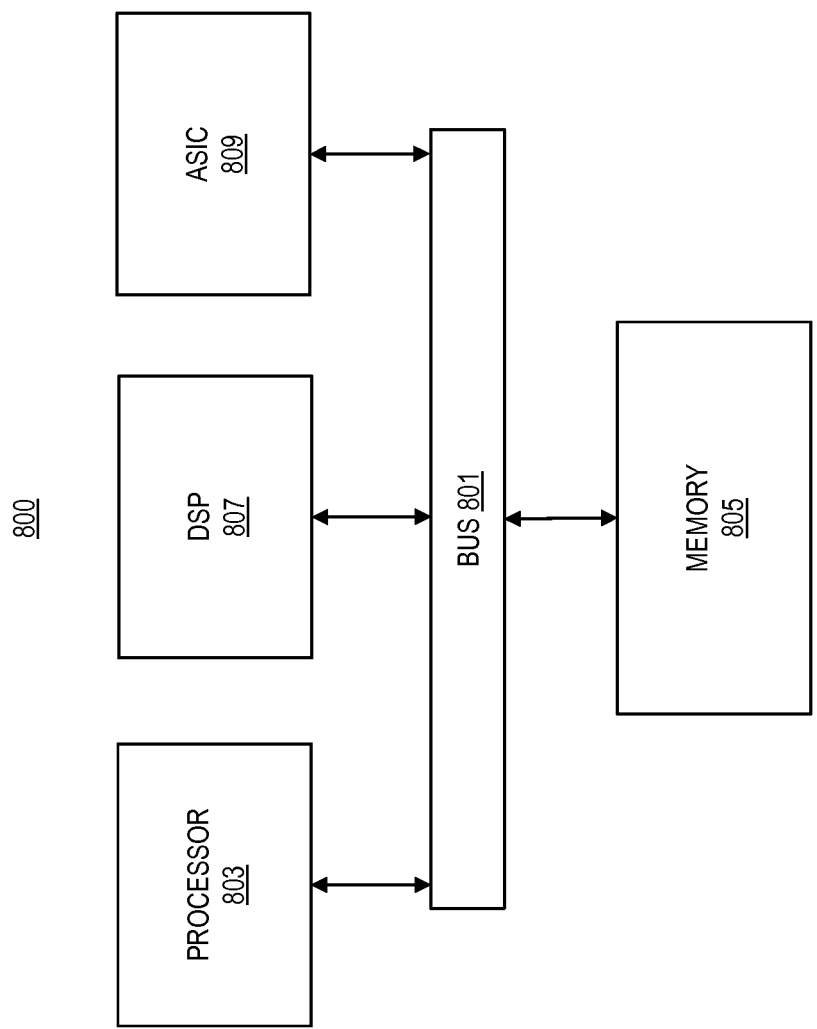

APPARATUS AND METHOD FOR IMPROVED MODULATION AND CODING SCHEMES FOR BROADBAND SATELLITE COMMUNICATIONS SYSTEMS

RELATED APPLICATIONS

This application is a Continuation-In-Part (CIP) of co-pending U.S. patent application Ser. No. 13/763,723 (filed Feb. 10, 2013), titled Apparatus and Method for Improved Modulation and Coding Schemes for Broadband Satellite Communications Systems, which is incorporated herein by reference in its entirety.

BACKGROUND

Over recent decades, developments in data communications technologies have continued to provide enhanced multimedia services (e.g., voice, data, video, etc.) to end-users. Such communications technologies encompass various delivery platforms, including terrestrial wire-line, fiber and wireless communications and networking technologies, and satellite communications and networking technologies. Further, in recent years, the proliferation of mobile communications has spurred an exponential growth in the provision of such enhanced multimedia services over mobile communications networks (both terrestrial and satellite based). As part of the continued evolution of such communications platforms and supporting technologies, the Digital Video Broadcasting (DVB) organization was formed (as an industry-led, global consortium of broadcasters, manufacturers, network operators, software developers, regulatory bodies and others) to advance the design of open interoperable standards for the global delivery of digital media and broadcast services.

As part of the standardization process for digital media and broadcast services, the DVB organization managed the adoption and publication of the DVB-S2 standard via recognized standards setting organizations (e.g., ETSI and TIA). DVB-S2 is a digital satellite transmission system standard covering framing structure, channel coding and modulation systems, designed for broadcast services (for standard and high definition television), interactive services (e.g., Internet access for consumer applications), and other broadband satellite applications. DVB-S2 represents a flexible standard, covering a variety of data and multimedia services delivered over satellite communications systems. The DVB-S2 standard covers various technological features, such as a flexible input stream adapter (suitable for operation with single and multiple input streams of various formats), a robust forward error correction coding (FEC) system based on low-density parity check (LDPC) codes concatenated with Bose Chaudhuri Hocquenghem (BCH) codes, a wide range of code rates (from 1/4 up to 9/10), four signal constellations (ranging in spectrum efficiency from 2 bit/s/Hz to 5 bit/s/Hz), and adaptive coding and modulation (ACM) functionality (optimizing channel coding and modulation on a frame-by-frame basis).

Since its inception, the DVB-S2 standard has been adopted globally as a predominant standard for broadcast, interactive and other broadband applications and services over satellite communications networks. Currently, there are applications and services for terminals, particularly in the field of mobile communications, that require operation at lower signal-to-noise ratios ($E_s/N_0$), down to approximately −9 dB to −10 dB. The current modulation and coding schemes (e.g., the modulation and coding schemes of the DVB-S2 standard), however, support operation down to $E_s/N_0$ ratios of only about −3 dB, and thus are unable to support the operational requirements for such current mobile and other low signal-to-noise ratio (SNR) terminals (e.g., below −3 dB). Further, the modulation and coding schemes of the current DVB-S2 standard ($E_s/N_0$ ratios within the range of approximately −3 dB to 15.5 dB) lack sufficient granularity to meet the requirements of terminals in the growing field of broadcast, interactive and other broadband applications and services over satellite communications networks.

What is needed, therefore, are systems and methods for providing modulation and coding schemes that support current and future communications services and applications for terminals with operational requirements at relatively low SNR and terminals, and to provide modulation and coding schemes that offer finer granularity (among existing modulation and coding schemes) within an intermediate operational range.

Some Exemplary Embodiments

The present invention advantageously addresses the foregoing requirements and needs, as well as others, by providing a system and methods for providing modulation and coding schemes that support current and future communications services and applications for terminals with operational requirements at relatively low $E_s/N_0$ ratios (e.g., within the operational range of approximately −3 dB to −10 dB), and to provide modulation and coding schemes that offer finer granularity within an intermediate operational range of $E_s/N_0$ ratios (e.g., approximately −3 dB to 15.5 dB).

According to an exemplary embodiment, a method comprises encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length. The structured parity check matrix is represented by tabular information (a code table) of a format wherein each row represents occurrences of one values within a respective column of the parity check matrix, and the columns of the parity check matrix are derived according to a predetermined operation based on the respective rows of the tabular information, and wherein the code table comprises one of a selection of new LDPC code designs (each represented by a respective code table). According to the method, the encoding wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises: initializing parity bit accumulators for $p_0, p_1, \ldots, p_{n_{ldpc}-k_{ldpc}-1}$ to zero; accumulating information bit $i_0$ at parity bit accumulator addresses specified in the first row of the table; for the next group of m−1 information bits, $i_y$ (y=1, 2, …, m−1), accumulating each information bit at parity bit accumulator addresses {x+(y mod m)*q} mod ($n_{ldpc}-k_{ldpc}$), wherein x denotes an address of a parity bit accumulator corresponding to the information bit $i_0$, and q is a code-rate dependent constant (q=($n_{ldpc}-k$)/m), and wherein m is a code-dependent constant and k=R*n (where R is the code rate); accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, …, 2m) at {x+(z mod m)*q} mod ($n_{ldpc}-k_{ldpc}$), wherein x denotes the address of the parity bit accumulator corresponding to the information bit $i_m$ (the entries of the second row of the table); in a similar manner, for each subsequent group of m information bits, accumulating the information bits at parity bit addresses based on a next row of the table; and after all of the information bits of the frame are accumulated, performing operations according to $p_i=p_i \oplus p_{i-1}$, wherein for i=1, 2, . . . , ($n_{ldpc}-k_{ldpc}-1$), each $p_i$ resulting from the operation for a given i is equal to the parity bit $p_i$.

According to a further exemplary embodiment, the method further comprises interleaving each coded LDPC frame using a block interleaver, wherein the coded bits are written into an interleaver array on a column-by-column basis and read out on a row-by-row basis, and the output of the interleaving comprises coded FEC frames. The interleaver array comprises a number of rows and a number of columns, and the coded bits are read out of each row in a predetermined order, wherein the number of columns in the interleaver array is based on a selected modulation scheme, and the coded bits are read out of each row of the interleaver array in a predetermined order based on the selected modulation scheme and a selected code rate.

According to yet a further exemplary embodiment, the method further comprises modulating the coded FEC frames according to a selected modulation scheme, wherein the selected modulation scheme comprises one of the following modulation types: π/2 BPSK (Binary Phase Shift Keying), QPSK (Quadrature Phase Shift Keying), 8-PSK (Phase Shift Keying), 16-APSK (Amplitude Phase Shift Keying), and 32-APSK, wherein, in the case of π/2 BPSK or QPSK, the coded FEC frames are not interleaved.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A illustrates a communications system capable of employing modulation and coding protocols, in accordance with exemplary embodiments of the present invention;

FIG. 2A illustrates a block diagram of an exemplary transmitter configured to operate in the systems of FIGS. 1A and 1B, in accordance with exemplary embodiments of the present invention;

FIG. 2B illustrates a block diagram of an exemplary receiver configured to operate in the systems of FIGS. 1A and 1B, in accordance with exemplary embodiments of the present invention;

FIG. 8 illustrates a block diagram of a chip set that can be utilized in implementing communications system protocols, according to exemplary embodiments of the present invention.

DETAILED DESCRIPTION

Figure 1B:
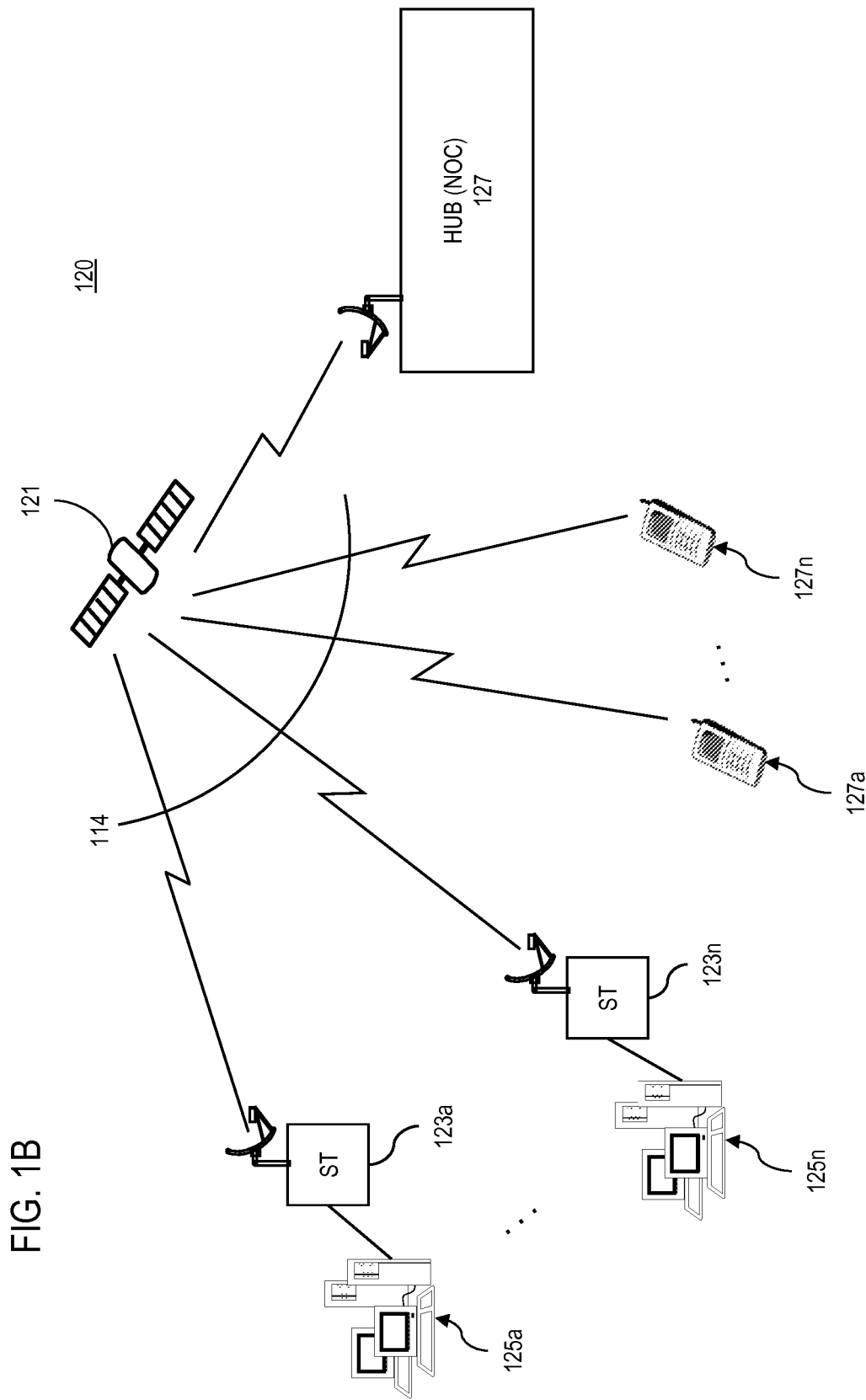
FIG. 1B illustrates a satellite communications system capable of employing modulation and coding protocols, in accordance with exemplary embodiments of the present invention.

A system and methods for communications system protocols to support communications services and applications over relatively low signal-to-noise ratio ($E_s/N_0$) links, is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

FIG. 1A illustrates a communications system capable of employing modulation and coding protocols, in accordance with exemplary embodiments of the present invention. With reference to FIG. 1A, a broadband communications system 110 includes one or more transmitters 112 (of which one is shown) that generate signal waveforms for transmission to one or more receivers 116 (of which one is shown). The signal waveforms are transmitted across a communications channel 114, which (for example) may comprise a channel of a terrestrial, wireless terrestrial or satellite communications system. In this discrete communications system 110, the transmitter 112 has a signal source that produces a discrete set of data signals, where each of the data signals is transmitted over a corresponding signal waveform. The discrete set of data signals may first be encoded (e.g., via a forward error correction (FEC) code) to combat noise and other issues associated with the channel 114. Once encoded, the encoded signals may then be modulated onto a carrier for transmission over the channel 114. The signal waveforms are attenuated, or otherwise altered, by communications channel 114.

FEC is required in terrestrial and satellite systems to provide high quality communication over a radio frequency (RF) propagation channel, which induces signal waveform and spectrum distortions, including signal attenuation (freespace propagation loss), multi-path induced fading and adjacent channel interference. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

FIG. 1B illustrates a satellite communications system capable of employing modulation and coding protocols, in accordance with exemplary embodiments of the present invention. With reference to FIG. 1B, satellite communications system 120 includes a satellite 121 that supports communication among multiple satellite terminals (STs) 123a-123n, user terminals (UTs) 127a-127n, and a hub 127. The HUB 127 may assume the role of a Network Operations Center (NOC), which controls the access of the STs 123a-123n and UTs 127a-127n to the system 120, and also provides element management functions and control of the address resolution and resource management functionality. The Satellite communications system 120 may operate as a traditional bent-pipe system, where the satellite essentially operates as a repeater. Alternatively, the system 120 may employ a switching or processing satellite supporting mesh communications (point-to-point communications directly between a pair of the STs 123a-123n and UTs 127a-127n).

In a traditional bent-pipe system of an exemplary embodiment, for example, the satellite operates as a repeater or bent pipe, and communications between the STs 123a-123n and UTs 127a-127n are transmitted over a double-hop path. For example, in a communication from ST 123a to ST 123n, over the first hop, the communication is transmitted, via the satellite, from the ST 123a to the HUB 127. The HUB 127 decodes the communication and determines the destination as ST 123n. The HUB 127 then appropriately addresses and repackages the communication, encodes and modulates it, and transmits the communication over the second hop, via the satellite, to the destination ST 123n. Accordingly, the satellite of such a system acts as a bent pipe or repeater, transmitting communications between the HUB 127 and the STs/UTs.

In an alternate embodiment, with a communications system 120 that employs a processing satellite (e.g., including a packet switch operating, for example, at a data link layer), the system may support direct unicast (point-to-point) communications and multicast communications among the STs 123a-123n and UTs 127a-127n. In the case of a processing satellite, the satellite 121 decodes the received signal and determines the destination ST(s)/UT(s) (as the hub 127 would in a bent-pipe system). The satellite 121 then addresses the data accordingly, encodes and modulates it, and transmits the modulated signal, over the channel 114, to the destination ST(s)/UT(s). Further, the STs 123a-123n may each provide connectivity to one or more respective hosts (e.g., hosts 125a-125n, respectively).

Further, based on recent trends in the advancement of current applications and services and in the development of new applications and services, it is envisioned that systems employing a multiplexing of data signals on the same channel 114 (e.g., time multiplexed), where (on a frame-by-frame basis) such data signals may be destined for different receive terminals of different capabilities (e.g., any combination of STs 125a-125n and UTs 127a-127n. For example, data signals destined for high S/N terminals (e.g., any of the STs 125a-125n) may be multiplexed with data signals destined for lower S/N terminals (e.g., any of the UTs 127a-127n), on the same channel 114 (on a frame-by-frame basis).

FIG. 2A illustrates a block diagram of an exemplary transmitter configured to operate in the systems of FIGS. 1A and 1B, in accordance with exemplary embodiments of the present invention. With reference to FIG. 2A, the transmitter 210 is equipped with a data encapsulation module 211 that accepts the original application layer source data and performs the upper layer encapsulation to from the baseband frames. The encoder (e.g., an FEC encoder) 213 receives the baseband frames from the data encapsulation module 211, and outputs a coded stream of higher redundancy suitable for error correction processing at the receiver (shown in FIG. 6). The encoded signal is fed to the modulator 215, which maps the encoded messages to signal waveforms, based in part on modulation signal constellations. For example, the data encapsulation module 211 performs the upper layer encapsulation to generate the baseband frames based on the source data bits, and then the encoder 213 and modulator 215 collectively perform the modulation and coding of the baseband frames and the generation of the physical layer frames, in accordance with the exemplary embodiments of the present invention. The physical layer frames are then transmitted (as signal waveforms), via the transmit antenna 217, over the communication channel 114 to the satellite 121.

FIG. 2B illustrates a block diagram of an exemplary receiver configured to operate in the systems of FIGS. 1A and 1B, in accordance with exemplary embodiments of the present invention. With reference to FIG. 2B, the receiver 220 comprises receive antenna 229, sync module 227 demodulator 225, decoder 223 and de-encapsulation module 221. The receive antenna 229 receives the signal waveform transmitted over the channel 114 from the satellite 121. The sync module 227 detects the unique word, performs synchronization and determines the modcod and other PLS signaling of the PL Header. The demodulator 225 demodulates the received signal waveforms, based in part on the signal constellation employed for the modulation, to obtain the encoded signals. The decoder 223 then decodes the demodulated bit sequence to generate the encapsulated message data, and the de-encapsulation module 221 de-encapsulates the message data to regenerate the original source data.

As mentioned above, as one exemplary embodiment for broadcast and broadband communications services over satellite networks, the DVB-S2 standard has been adopted globally as a predominant standard for broadcast, interactive and other broadband services and applications. The framing structure, channel coding and modulation systems of the DVB-S2 standard are described in the European Telecommunications Standards Institute (ETSI) publication, ETSI EN 302 307 V1.3.1, which is incorporated herein by reference in its entirety. DVB-S2 represents a flexible standard, covering a variety of data and multimedia services delivered over satellite communications systems. Generic Stream Encapsulation (GSE) protocols may be employed to provide a data link layer protocol that facilitates the transmission of user or application data from packet oriented protocols (e.g., Internet protocol or IP) on top of a unidirectional physical layer protocol (e.g., DVB-S2). According to the GSE protocol, application data in the form of packet data units (PDUs) are first encapsulated within the baseband frames of the communications network (e.g., DVB-S2 baseband packets in a satellite communications system).

The DVB-S2 standard, for example, was designed to facilitate robust synchronization and signaling at the physical layer, and synchronization and detection of the modulation and coding parameters by a receiver before demodulation and FEC decoding. At the physical layer, baseband frames are encoded to form an output stream of FEC Frames. For example, the baseband frames are encoded by the FEC encoder 213, which comprises a t-error BCH outer coding via the BCH encoder 213a, an LDPC inner coding via the LDPC encoder 213b, and bit interleaving via the bit interleaver 213c. The interleaver 213c reorders the encoded sequence of symbols or bits from the LDPC encoder 213b in a predetermined manner. More specifically, the FEC coding subsystem of DVB-S2 comprises a BCH outer coding, LDPC inner coding and bit interleaving. The input to the FEC subsystem consists of a data stream of baseband frames, where each baseband frame of $K_{bch}$ bits is processed by the coding system to produce an FEC Frame of $n_{ldpc}$ bits, where $n_{ldpc}$=64,800 for a normal FEC Frame and $n_{ldpc}$=16,200 for a short FEC Frame.

Physical Layer framing is then performed, by slicing the XFEC Frames into a number of fixed length slots (of length M=90 symbols each), to generate the physical layer frames, as specified in Section 5.5 of the above-incorporated DVB-S2 publication, ETSI EN 302 307.

For the outer BCH coding, the BCH coding parameters are specified in the following tables:

TABLE 1a

Coding Parameters (normal FEC Frame - LDPC Coded Block $n_{ldpc}$ = 64800)

| LDPC Code Rate | BCH Uncoded Block $K_{bch}$ | BCH Coded Block $N_{bch}$ LDPC Uncoded Block $k_{ldpc}$ | BCH t-Error Correction (bits) |
|---|---|---|---|
| 1/4 | 16008 | 16200 | 12 |
| 1/3 | 21408 | 21600 | 12 |
| 2/5 | 25728 | 25920 | 12 |
| 1/2 | 32208 | 32400 | 12 |
| 3/5 | 36688 | 38880 | 12 |
| 2/3 | 43040 | 43200 | 10 |
| 3/4 | 48408 | 48600 | 12 |
| 4/5 | 51648 | 51840 | 12 |
| 5/6 | 53840 | 54000 | 10 |
| 8/9 | 57472 | 57600 | 8 |
| 9/10 | 58192 | 58320 | 8 |

TABLE 1b

Coding Parameters (short FEC Frame - LDPC Coded Block $n_{ldpc}$ = 16200)

| LDPC Code Rate | BCH Uncoded Block $K_{bch}$ | BCH Coded Block $N_{bch}$ LDPC Uncoded Block $k_{ldpc}$ | BCH t-Error Correction (bits) | Effective LDPC Rate ($k_{ldpc}$/16200) |
|---|---|---|---|---|
| 1/4 | 3072 | 3240 | 12 | 1/5 |
| 1/3 | 5232 | 5400 | 12 | 1/3 |
| 2/5 | 6312 | 6480 | 12 | 2/5 |
| 1/2 | 7032 | 7200 | 12 | 4/9 |
| 3/5 | 9552 | 9720 | 12 | 3/5 |
| 2/3 | 10632 | 10800 | 12 | 2/3 |
| 3/4 | 11712 | 11880 | 12 | 11/15 |
| 4/5 | 12432 | 12600 | 12 | 7/9 |
| 5/6 | 13152 | 13320 | 12 | 37/45 |
| 8/9 | 14232 | 14400 | 12 | 8/9 |
| 9/10 | N/A | N/A | N/A | N/A |

The generator polynomial of the BCH encoder is obtained by multiplying the first t polynomials specified in the following tables:

TABLE 2a

BCH Polynomials (normal FEC Frame-LDPC Coded Block $n_{ldpc}$ = 64800)

| | |
|---|---|
| $g_1(X)$ | $1 + X^2 + X^3 + X^5 + X^{16}$ |
| $g_2(X)$ | $1 + X + X^4 + X^5 + X^6 + X^8 + X^{16}$ |
| $g_3(X)$ | $1 + X^2 + X^3 + X^4 + X^5 + X^7 + X^8 + X^9 + X^{10} + X^{11} + X^{16}$ |
| $g_4(X)$ | $1 + X^2 + X^4 + X^6 + X^9 + X^{11} + X^{12} + X^{14} + X^{16}$ |
| $g_5(X)$ | $1 + X + X^2 + X^3 + X^5 + X^8 + X^9 + X^{10} + X^{11} + X^{12} + X^{16}$ |
| $g_6(X)$ | $1 + X^2 + X^4 + X^5 + X^7 + X^8 + X^9 + X^{10} + X^{12} + X^{13} + X^{14} + X^{15} + X^{16}$ |
| $g_7(X)$ | $1 + X^2 + X^5 + X^6 + X^8 + X^9 + X^{10} + X^{11} + X^{13} + X^{15} + X^{16}$ |
| $g_8(X)$ | $1 + X + X^2 + X^5 + X^6 + X^8 + X^9 + X^{12} + X^{13} + X^{14} + X^{16}$ |
| $g_9(X)$ | $1 + X^5 + X^7 + X^9 + X^{10} + X^{11} + X^{16}$ |
| $g_{10}(X)$ | $1 + X + X^2 + X^5 + X^7 + X^8 + X^{10} + X^{12} + X^{13} + X^{14} + X^{16}$ |
| $g_{11}(X)$ | $1 + X^2 + X^3 + X^5 + X^9 + X^{11} + X^{12} + X^{13} + X^{16}$ |
| $g_{12}(X)$ | $1 + X + X^5 + X^6 + X^7 + X^9 + X^{11} + X^{12} + X^{16}$ |

TABLE 2b

BCH Polynomials (short FEC Frame-LDPC Coded Block $n_{ldpc}$ = 16200)

| | |
|---|---|
| $g_1(X)$ | $1 + X + X^3 + X^5 + X^{14}$ |
| $g_2(X)$ | $1 + X^6 + X^8 + X^{11} + X^{14}$ |
| $g_3(X)$ | $1 + X + X^2 + X^6 + X^9 + X^{10} + X^{14}$ |
| $g_4(X)$ | $1 + X^4 + X^7 + X^8 + X^{10} + X^{12} + X^{14}$ |
| $g_5(X)$ | $1 + X^2 + X^4 + X^6 + X^8 + X^9 + X^{11} + X^{13} + X^{14}$ |
| $g_6(X)$ | $1 + X^3 + X^7 + X^8 + X^9 + X^{13} + X^{14}$ |
| $g_7(X)$ | $1 + X^2 + X^5 + X^6 + X^7 + X^{10} + X^{11} + X^{13} + X^{14}$ |
| $g_8(X)$ | $1 + X^5 + X^8 + X^9 + X^{10} + X^{11} + X^{14}$ |
| $g_9(X)$ | $1 + X + X^2 + X^3 + X^9 + X^{10} + X^{14}$ |
| $g_{10}(X)$ | $1 + X^3 + X^6 + X^9 + X^{11} + X^{12} + X^{14}$ |
| $g_{11}(X)$ | $1 + X^4 + X^{11} + X^{12} + X^{14}$ |
| $g_{12}(X)$ | $1 + X + X^2 + X^3 + X^5 + X^6 + X^7 + X^8 + X^{10} + X^{13} + X^{14}$ |

The BCH encoding of information bits $m=(m_{k_{bch}-1}, m_{k_{bch}-2}, \ldots m_1, m_0)$ onto a codeword $c=(m_{k_{bch}-1}, m_{k_{bch}-2}, \ldots, m_1, m_0, d_{n_{bch}-k_{bch}-1}, d_{n_{bch}-k_{bch}-2}, \ldots d_1, d_0)$ is achieved as follows: (1) multiply the message polynomial $m(x) = (m_{k_{bch}-1}x^{k_{bch}-1} + m_{k_{bch}-2}x^{k_{bch}-2} + \ldots + m_1 x + m_0)$ by $x^{n_{bch}-k_{bch}}$; (2) divide $x^{n_{bch}-k_{bch}}m(x)$ by the generator polynomial $g(x)$, where $d(x)=(d_{n_{bch}-k_{bch}-1}x^{n_{bch}-k_{bch}-1} + \ldots + d_1 x + d_0)$ is the remainder; and (3) set the codeword polynomial $c(x)=x^{n_{bch}-k_{bch}}m(x)+d(x)$.

Next, for the LDPC inner coding, the LDPC encoder systematically encodes an information block of size $k_{ldpc}$, $i=(i_0, i_1, \ldots, i_{k_{ldpc}-1})$ onto a codeword of size $n_{ldpc}$, $c=(i_0, i_1, \ldots i_{k_{ldpc}-1}, p_0, p_1, \ldots, p_{n_{ldpc}-k_{ldpc}-1})$. The transmission of the codeword starts in the given order from $i_0$ and ends with $p_{n_{ldpc}-k_{ldpc}-1}$. The LDPC code parameters ($k_{ldpc}$, $n_{ldpc}$) are specified in the above tables 1a and 1b. For backwards compatible modes, the output of the inner code is processed according to Annex F of the above-incorporated DVB-S2 publication, ETSI EN 302 307.

The task of the LDPC encoder is to determine $n_{ldpc}-k_{ldpc}$ parity bits ($p_0, p_1, \ldots p_{n_{ldpc}-k_{ldpc}-1}$) for every block of $k_{ldpc}$ information bits ($i_0, i_1, \ldots, i_{k_{ldpc}-1}$) The procedure is as follows: (1) initialize $p_0=p_1=\ldots=p_{n_{ldpc}-k_{ldpc}-1}=0$; (2) for the first information bit $i_0$, accumulate $i_0$ at the parity bit addresses specified in the first row of the table for the respective code rate and FEC Frame size—The tables are specified in Annexes B and C of the above-incorporated DVB-S2 publication, ETSI EN 302 307. For example, for the rate 2/3 code for $n_{ldpc}$=64800 (Table B.6 of Annex B), where all additions are in GF(2):

$p_0 = p_0 \oplus i_0$
$p_{10491} = p_{10491} \oplus i_0$
$p_{16043} = p_{16043} \oplus i_0$
$p_{506} = p_{506} \oplus i_0$
$p_{12826} = p_{12826} \oplus i_0$
$p_{8065} = p_{8065} \oplus i_0$
$p_{8226} = p_{8226} \oplus i_0$
$p_{2767} = p_{2767} \oplus i_0$
$p_{240} = p_{240} \oplus i_0$
$p_{18673} = p_{18673} \oplus i_0$ $p_{9279} = p_{9279} \oplus i_0$
$p_{10579} = p_{10579} \oplus i_0$
$p_{20928} = p_{20928} \oplus i_0$ (3) for the next 359 information bits $i_m$, m=1, 2, ..., 359, accumulate $i_m$ at parity bit addresses {x+m mod 360*q} mod $(n_{ldpc}-k_{ldpc})$, where x denotes the address of the parity bit accumulator corresponding to the first bit $i_0$, and q is a code rate dependent constant (specified in Tables 3a and 3b, below). Continuing with the example for the rate 2/3 code for $n_{ldpc}$=64800, q=60—so, for example, for information bit $t_1$, the following operations are performed:

$p_{60} = p_{60} \oplus i_1$
$p_{10551} = p_{10551} \oplus i_1$
$p_{16103} = p_{16103} \oplus i_1$
$p_{566} = p_{566} \oplus i_1$
$p_{12886} = p_{12886} \oplus i_1$
$p_{8125} = p_{8125} \oplus i_1$
$p_{8286} = p_{8286} \oplus i_1$
$p_{2827} = p_{2827} \oplus i_1$
$p_{300} = p_{300} \oplus i_1$
$p_{18733} = p_{18733} \oplus i_1$
$p_{9339} = p_{9339} \oplus i_1$
$p_{10639} = p_{10639} \oplus i_1$
$p_{20988} = p_{20988} \oplus i_1$ (4) for the 361$^{st}$ information bit $i_{360}$, accumulate $i_{360}$ at the parity bit addresses specified in the second row of the appropriate table (in Annexes B and C of ETSI EN 302 307) table for the respective code rate and FEC Frame size. Then, in a similar manner the addresses of the parity bit accumulators for the following 359 information bits $i_m$, m=361, 362, ..., 719 are obtained using the formula {x+m mod 360*q} mod $(n_{ldpc}-k_{ldpc})$, where x denotes the address of the parity bit accumulator corresponding to the first bit $i_{360}$, (the entries of the second row of the respective table); and (5) in a similar manner, for every group of 360 new information bits, a new row from the respective table is used to find the addresses of the parity bit accumulators.

Then, once all the information bits are exhausted, the final parity bits are obtained by sequentially performing the following operations, starting with i=1, $p_i = p_i \oplus p_{i-1}$, where i=1, 2, ..., $n_{ldpc}-k_{ldpc}-1$, and then the final content of $p_i$, i=0, 1, ..., $n_{ldpc}-k_{ldpc}-1$ is equal to the parity bit $p_i$.

TABLE 3a q Values (normal FEC Frame-LDPC Coded Block $n_{ldpc}$ = 64800)

| LDPC Code Rate | q |
|---|---|
| 1/4 | 135 |
| 1/3 | 120 |
| 2/5 | 108 |
| 1/2 | 90 |
| 3/5 | 72 |
| 2/3 | 60 |
| 3/4 | 45 |
| 4/5 | 36 |
| 5/6 | 30 |
| 8/9 | 20 |
| 9/10 | 18 |

TABLE 3b q Values (short FEC Frame-LDPC Coded Block $n_{ldpc}$ = 16200)

| LDPC Code Rate | q |
|---|---|
| 1/4 | 36 |
| 1/3 | 30 |
| 2/5 | 27 |

TABLE 3b-continued q Values (short FEC Frame-LDPC Coded Block $n_{ldpc}$ = 16200)

| LDPC Code Rate | q |
|---|---|
| 1/2 | 25 |
| 3/5 | 18 |
| 2/3 | 15 |
| 3/4 | 12 |
| 4/5 | 10 |
| 5/6 | 8 |
| 8/9 | 5 |

Figure 3A:
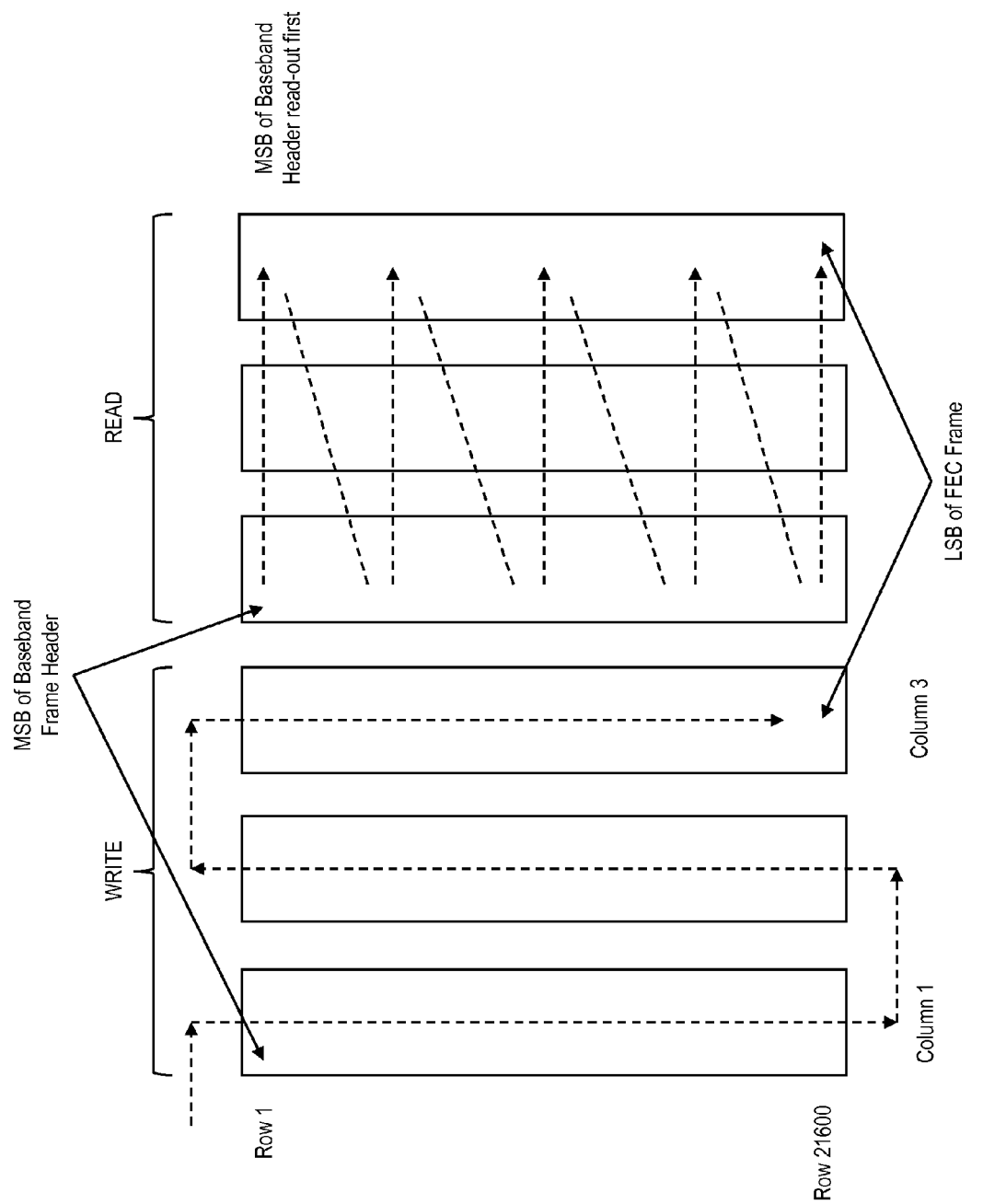
FIG. 3A illustrates the bit interleaving scheme for the 8PSK modulation formats (for all rates except rate 3/5) of the DVB-S2 standard for the normal FEC Frame length.
Figure 3B:
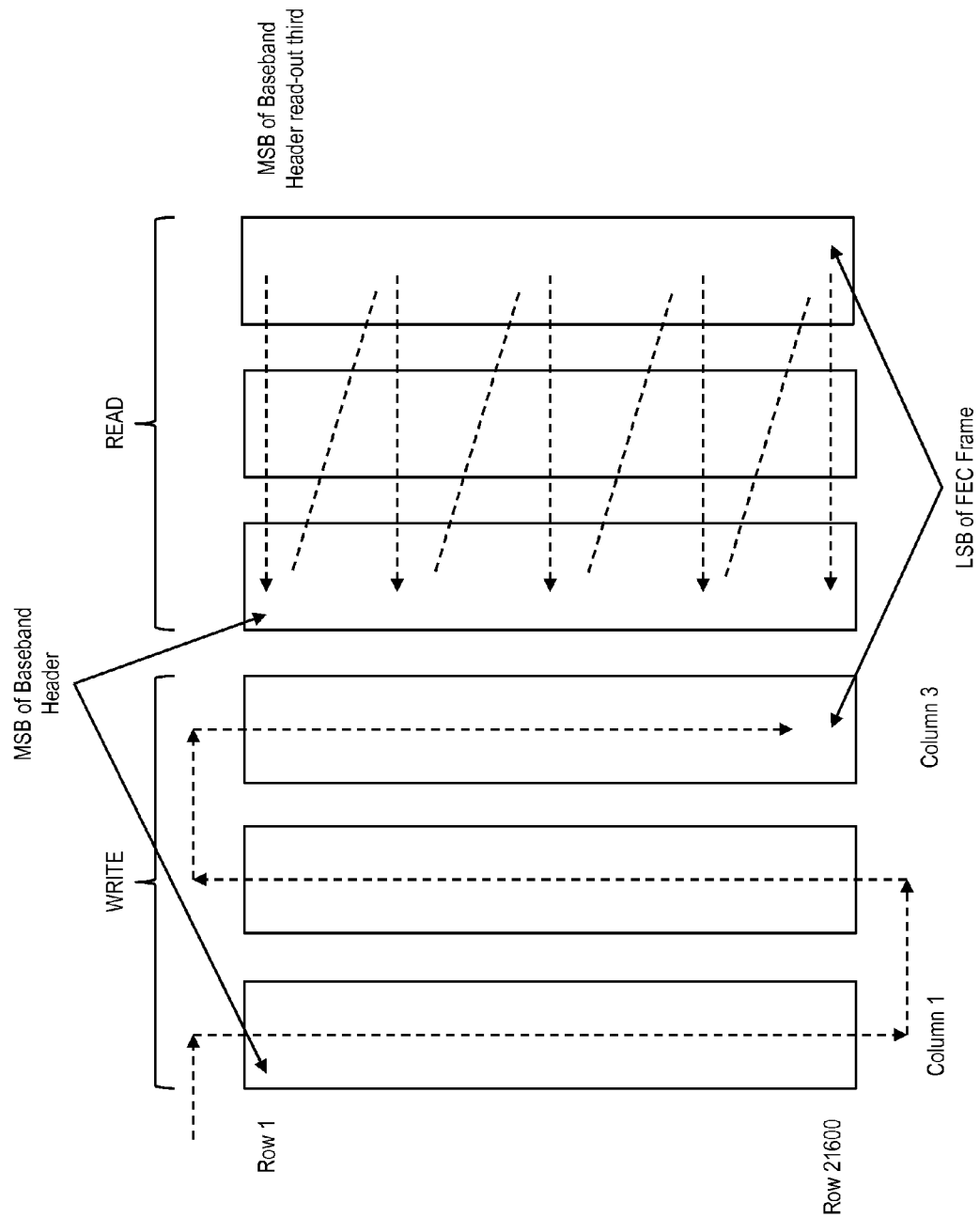
FIG. 3B illustrates the bit interleaving scheme for the 8PSK modulation formats (for rate 3/5 only) of the DVB-S2 standard for the normal FEC Frame length.

With reference to FIGS. 3A and 3B, for the 8PSK, 16APSK and 32APSK modulation schemes of the DVB-S2 standard, the bit interleaver 213c comprises a block interleaver that interleaves the output of the LDPC encoder 213b. Data is serially written into the interleaver column-wise, and serially read out row-wise (the MSB of baseband frame header is read out first, except in the case of the 8PSK rate 3/5 modulation where MSB of the baseband frame header is read out third), as illustrated in FIGS. 3A and 3B, respectively. The configuration of the block interleaver for each modulation format is specified in the following table:

TABLE 4

Block Interleaver Configurations

| Modulation | Rows ($n_{ldpc}$ = 64800) | Rows ($n_{ldpc}$ = 16200) | Columns |
|---|---|---|---|
| 8PSK | 21600 | 5400 | 3 |
| 16APSK | 16200 | 4050 | 4 |
| 32APSK | 12960 | 3240 | 5 |

For the DVB-S2 modulation, each FEC Frame (comprising a sequence of 64,800 bits for a normal FEC Frame, or 16,200 bits for a short FEC Frame) is then modulated based on one of various options specified in the standard for modulation of the data payload (e.g., QPSK, 8PSK, 16APSK, or 32APSK). For example, each FEC Frame is serial-to-parallel converted with the following parallelism levels: $\eta_{MOD}$ 2 for QPSK; $\eta_{MOD}$ 3 for 8PSK; $\eta_{MOD}$ 4 for 16APSK; $\eta_{MOD}$ 5 for 32APSK. Then, each resulting parallel sequence is mapped based on a signal constellation, generating an (I, Q) sequence of variable length depending on the selected modulation efficiency ($\eta_{MOD}$ bits/Hz). The DVB-S2 signal constellations for the QPSK, 8PSK, 16APSK, and 32APSK modulation schemes are illustrated in FIGS. 9-12 (respectively) of the above-incorporated DVB-S2 publication, ETSI EN 302 307. The resulting output sequence is referred to as a complex FEC Frame or XFEC Frame, composed of 64,800/$\eta_{MOD}$(normal XFEC Frame) modulation symbols, or 16,200/$\eta_{MOD}$(short XFEC Frame) modulation symbols. Each modulation symbol thereby comprises a complex vector in the format (I, Q) (I being the in-phase component and Q the quadrature component), or in the equivalent format $\rho \exp j\emptyset$ ($\rho$ being the modulus of the vector and $\emptyset$ being its phase).

Figure 4:
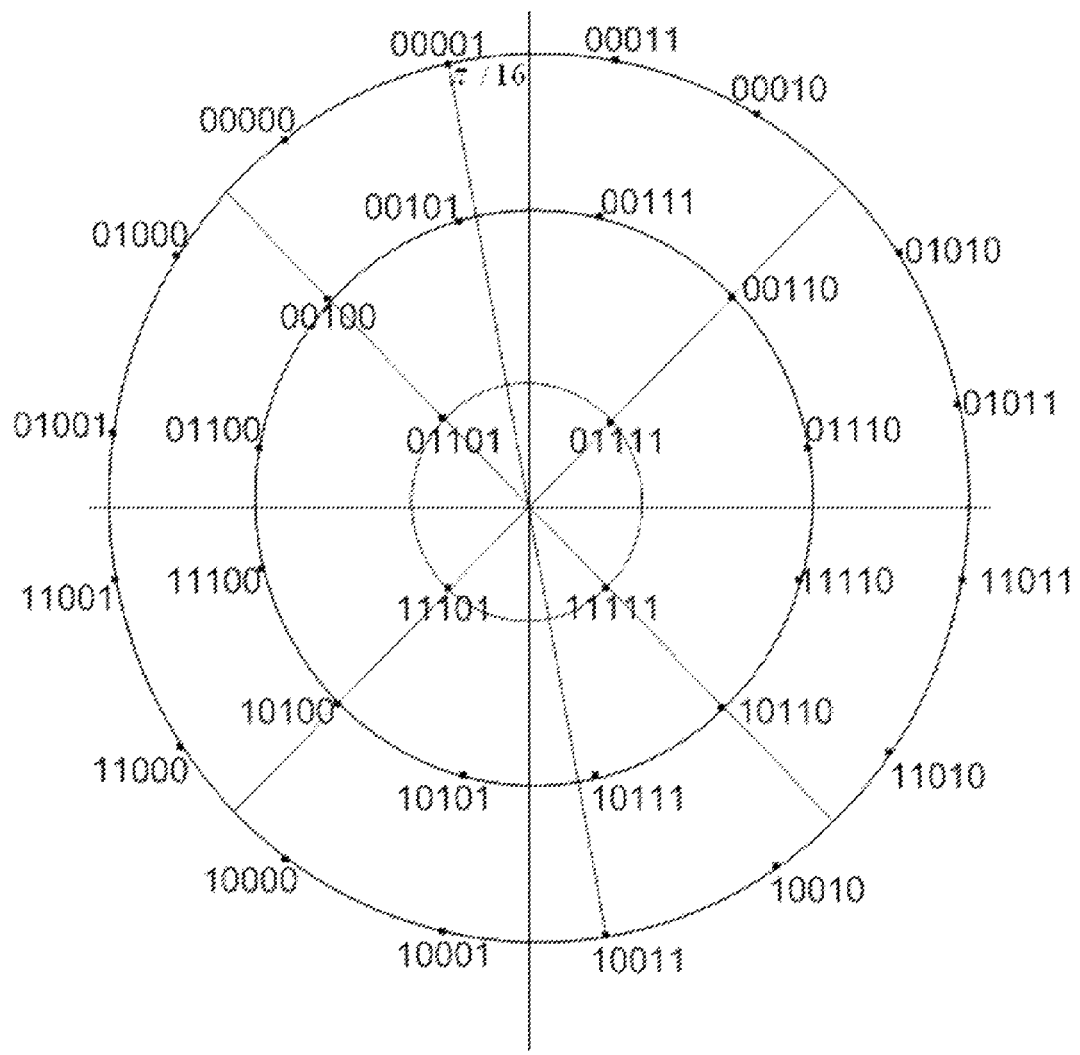
FIG. 4 illustrates a prior art 32APSK (4+12+16) signal constellation.

With respect to other current modulation schemes, copending U.S. patent application Ser. No. 13/327,316, which is incorporated herein in its entirety, provides a 32APSK constellation. The 32APSK signal constellation is provided with a ring format of 4+12+16 (4 constellation points on the innermost ring, 12 constellation points on the next outer ring, and 16 constellation points on the outer-most ring). The bit labeling and [x, y] signal point coordinates (where the outer ring is rotated by $\pi/16$ as compared to the DVB-S2 32APSK constellation) of this 32APSK constellation are as follows (where $\epsilon_x$ represents average energy per symbol, $4*R1^2+12*R2^2+$ 16*R3²=32, and R1 represents the radius of the inner-most ring, R2 represents the radius of the middle ring and R3 represents the radius of the outer ring), as further illustrated in FIG. 4:

| Bit Label | [x, y] Coordinates |
|---|---|
| 00000 | [−R3 * $\sqrt{\epsilon_x}$ * cos(5.0 * π/16.0), R3 * $\sqrt{\epsilon_x}$ * cos(3.0 * π/16.0)] |
| 00001 | [−R3 * $\sqrt{\epsilon_x}$ * cos(7.0 * π/16.0), R3 * $\sqrt{\epsilon_x}$ * cos(π/16.0)] |
| 00010 | [R3 * $\sqrt{\epsilon_x}$ * cos(5.0 * π/16.0), R3 * $\sqrt{\epsilon_x}$ * cos(3.0 * π/16.0)] |
| 00011 | [R3 * $\sqrt{\epsilon_x}$ * cos(7.0 * π/16.0), R3 * $\sqrt{\epsilon_x}$ * cos(π/16.0)] |
| 00100 | [−R2 * $\sqrt{\epsilon_x}$ * sin(π/4.0), R2 * $\sqrt{\epsilon_x}$ * sin(π/4.0)] |
| 00101 | [−R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [−R3 * $\sqrt{\epsilon_x}$ * cos(3.0 * π/16.0), R3 * $\sqrt{\epsilon_x}$ * cos(5.0 * π/16.0)] |
| 01001 | [−R3 * $\sqrt{\epsilon_x}$ * cos(π/16.0), R3 * $\sqrt{\epsilon_x}$ * cos(7.0 * π/16.0)] |
| 01010 | [R3 * $\sqrt{\epsilon_x}$ * cos(3.0 * π/16.0), R3 * $\sqrt{\epsilon_x}$ * cos(5.0 * π/16.0)] |
| 01011 | [R3 * $\sqrt{\epsilon_x}$ * cos(π/16.0), R3 * $\sqrt{\epsilon_x}$ * cos(7.0 * π/16.0)] |
| 01100 | [−R2 * $\sqrt{\epsilon_x}$ * sin(5.0 * π/12.0), R2 * $\sqrt{\epsilon_x}$ * sin(π/12.0)] |
| 01101 | [−R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [−R3 * $\sqrt{\epsilon_x}$ * cos(5.0 * π/16.0), −R3 * $\sqrt{\epsilon_x}$ * cos(3.0 * π/16.0)] |
| 10001 | [−R3 * $\sqrt{\epsilon_x}$ * cos(7.0 * π/16.0), −R3 * $\sqrt{\epsilon_x}$ * cos(π/16.0)] |
| 10010 | [R3 * $\sqrt{\epsilon_x}$ * cos(5.0 * π/16.0), −R3 * $\sqrt{\epsilon_x}$ * cos(3.0 * π/16.0)] |
| 10011 | [R3 * $\sqrt{\epsilon_x}$ * cos(7.0 * π/16.0), −R3 * $\sqrt{\epsilon_x}$ * cos(π/16.0)] |
| 10100 | [−R2 * $\sqrt{\epsilon_x}$ * sin(π/4.0), −R2 * $\sqrt{\epsilon_x}$ * sin(π/4.0)] |
| 10101 | [−R2 * $\sqrt{\epsilon_x}$ * sin(π/12.0), −R2 * $\sqrt{\epsilon_x}$ * sin(5.0 * π/12.0)] |
| 10110 | [R2 * $\sqrt{\epsilon_x}$ * sin(π/4.0), −R2 * $\sqrt{\epsilon_x}$ * sin(π/4.0)] |
| 10111 | [R2 * $\sqrt{\epsilon_x}$ * sin(π/12.0), −R2 * $\sqrt{\epsilon_x}$ * sin(5.0 * π/12.0)] |
| 11000 | [−R3 * $\sqrt{\epsilon_x}$ * cos(3.0 * π/16.0), −R3 * $\sqrt{\epsilon_x}$ * cos(5.0 * π/16.0)] |
| 11001 | [−R3 * $\sqrt{\epsilon_x}$ * cos(π/16.0), −R3 * $\sqrt{\epsilon_x}$ * cos(7.0 * π/16.0)] |
| 11010 | [R3 * $\sqrt{\epsilon_x}$ * cos(3.0 * π/16.0), −R3 * $\sqrt{\epsilon_x}$ * cos(5.0 * π/16.0)] |
| 11011 | [R3 * $\sqrt{\epsilon_x}$ * cos(π/16.0), −R3 * $\sqrt{\epsilon_x}$ * cos(7.0 * π/16.0)] |
| 11100 | [−R2 * $\sqrt{\epsilon_x}$ * sin(5.0 * π/12.0), −R2 * $\sqrt{\epsilon_x}$ * sin(π/12.0)] |
| 11101 | [−R1 * $\sqrt{\epsilon_x}$ * sin(π/4.0), −R1 * $\sqrt{\epsilon_x}$ * sin(π/4.0)] |
| 11110 | [R2 * $\sqrt{\epsilon_x}$ * sin(5.0 * π/12.0), −R2 * $\sqrt{\epsilon_x}$ * sin(π/12.0)] |
| 11111 | [R1 * $\sqrt{\epsilon_x}$ * sin(π/4.0), −R1 * $\sqrt{\epsilon_x}$ * sin(π/4.0)] |

This 32APSK constellation achieves improved performance over other current 32APSK modulation constellations (e.g., approximately 0.2 dB better performance over the 32APSK constellation of the DVB-S2 standard). Despite the better performance of this constellation, however, to maintain compatibility with the DVB-S2 standard (and preserve the 32APSK modcods thereof), the 32APSK constellation may be applied with only those new codes (and respective code rates), provided pursuant to the exemplary embodiments of the present invention, disclosed herein. As is evident, though, this 32APSK constellation could be applied with other codes (and respective code rates), such as those provided in the DVB-S2 standard.

As specified above, however, current modulation and coding schemes (e.g., the modulation and coding schemes of the DVB-S2 standard) lack support for the operational requirements of terminals at relatively low $E_s/N_0$ ratios (e.g., below approximately −3 dB). Additionally, such current modulation and coding schemes also lack sufficient granularity for terminals within an intermediate $E_s/N_0$ operational range (e.g., from approximately −3 dB to 15.5 dB). Moreover, codes of shorter block sizes are also needed within such operational ranges.

In accordance with exemplary embodiments of the present invention, therefore, modulation and coding schemes are provided that support terminals with operational requirements at relatively low $E_s/N_0$ ratios (e.g., within the range of approximately −3 dB to −10 dB), and that provide finer granularity for terminals with operational requirements within an intermediate operational range (e.g., approximately −3 dB to 15.5 dB). Further, such new modulation and coding schemes are provided with short block lengths. For example, exemplary embodiments provide the following new improved modulation and coding schemes:

TABLE 5

Modulation and Code Rates

| Modulation | Code Rate |
|---|---|
| π/2 BPSK, repeat twice | 11/45 |
| QPSK | 11/45 |
| QPSK | 14/45 |
| 8 PSK | 26/45 |
| 16 APSK | 26/45 |
| 8 PSK | 32/45 |
| 16 APSK | 32/45 |
| 32 APSK | 32/45 |
| 16 APSK | 3/5 |
| 32 APSK | 2/3 |

Additionally, with respect to the outer BCH coding of the FEC encoding, in accordance with exemplary embodiments of the present invention, the BCH t-error correcting capabilities are reflected in the following table:

TABLE 6

BCH t-Error Correction

| Modulation | Code Rate | BCH t-Error Correction |
|---|---|---|
| π/2 BPSK, repeat twice | 11/45 | 12 |
| QPSK | 11/45 | 12 |
| QPSK | 14/45 | 12 |
| 8 PSK | 26/45 | 12 |
| 16 APSK | 26/45 | 12 |
| 8 PSK | 32/45 | 12 |
| 16 APSK | 32/45 | 12 |
| 32 APSK | 32/45 | 12 |
| 16 APSK | 3/5 | 12 |
| 32 APSK | 2/3 | 12 |

Further, with respect to bit interleaving, exemplary embodiments of the present invention provide improved bit interleaving protocols. As specified above for the DVB-S2 standard, coded bits are written to the interleaver array column-by-column and read out row-by-row from left to right (except for the 8PSK 3/5 modcod—for which the bits are read out right to left). Referring to theses conventions as 0-1-2 for 8PSK, 0-1-2-3 for 16APSK, and 0-1-2-3-4 for 32APSK (and 2-1-0 for the 8PSK 3/5 modcod), according to embodiments of the present invention, the coded bits are similarly written to the interleaver array column-by-column, but are read out based on certain improved orders for the respective new modcods, as listed in the following table:

TABLE 7

Bit Interleaver Patterns

| Modulation | Code Rate | Bit Interleaver Pattern |
|---|---|---|
| π/2 BPSK, repeat twice | 11/45 | N/A |
| QPSK | 11/45 | N/A |
| QPSK | 14/45 | N/A |
| 8 PSK | 26/45 | 1-0-2 |
| 16 APSK | 26/45 | 2-1-3-0 |
| 8 PSK | 32/45 | 0-1-2 |

TABLE 7-continued

Bit Interleaver Patterns

| Modulation | Code Rate | Bit Interleaver Pattern |
|---|---|---|
| 16 APSK | 32/45 | 0-1-2-3 |
| 32 APSK | 32/45 | 1-0-4-2-3 |
| 16 APSK | 3/5 | 3-2-0-1 |
| 32 APSK | 2/3 | 4-1-2-3-0 |

With respect to the inner LDPC coding of the FEC encoding, in accordance with exemplary embodiments of the present invention, the respective parity bit accumulator address tables for the respective code rates and FEC Frame lengths are specified in the following parity bit accumulator tables (where, for each code rate R, the q values are as follows: $q=(n-k)/360$, (where $n=16200$ and $k=R*n$)):

TABLE 8 q Values

| Code Rate | q |
|---|---|
| 11/45 | 34 |
| 14/45 | 31 |
| 26/45 | 19 |
| 32/45 | 13 |
| 3/5 | 18 |
| 2/3 | 15 |

TABLE 9a

Address of Parity Bit Accumulators (Rate 11/45) ($n_{ldpc} = 16200$)

9054 9186 12155 1000 7383 6459 2992 4723 8135 11250
2624 9237 7139 12238 11962 4361 5292 10967 11036 8105
2044 11996 5654 7568 7002 3549 4767 8767 2872 8345
6966 8473 5180 8084 3359 5051 9576 5139 1893 902
3041 3801 8252 11951 909 8535 1038 8400 3200 4585
5291 10484 10872
442 7516 3720
11469 769 10998
10575 1436 2935
6905 8610 11285
1873 5634 6383

TABLE 9b

Address of Parity Bit Accumulators (Rate 14/45) ($n_{ldpc} = 16200$)

1606 3617 7973 6737 9495 4209 9209 4565 4250 7823 9384 400
4105 991 923 3562 3892 10993 5640 8196 6652 4653 9116 7677
6348 1341 5445 1494 7799 831 4952 5106 3011 9921 6537 8476
7854 5274 8572 3741 5674 11128 4097 1398 5671 7302 8155 2641
6548 2103 590 5749 5722 10 2682 1063 633 2949 207 6065
2828 6366 4766 399 935 7611 84 150 3146
5363 7455 7140
9297 482 4848
8458 1631 5344
5729 6767 4836
11019 4463 3882
4107 9610 5454
11137 4328 6307
3260 7897 3809

TABLE 9c

Address of Parity Bit Accumulators (Rate 26/45) ($n_{ldpc} = 16200$)

6106 5389 698 6749 6294 1653 1984 2167 6139 6095 3832 2468 6115
4202 2362 1852 1264 3564 6345 498 6137 3908 3302 527 2767 6667
3422 1242 1377 2238 2899 1974 1957 261 3463 4994 215 2338
3016 5109 6533 2665 5300 4908 4967 5787 726 229 1970 2789
6146 5765 6649 2871 884 1670 2597 5058 3659 6594 5042 304
5521 2811 0 4214 2626 2211 1236 3771 852 6356 6797 3463
1523 1830 3938 5593 2128 5791 3421 3680 6692 1377 3808 3475
5551 6035 2247 3662 759 6783 116 6380 4586 3367 1 5003
3518 6557 6510
1830 839 4421
5431 5959 6152
3174 5113 4520
5399 1303 2496
2841 741 220
2731 1830 4193
1875 3935 223
9 4720 423
3107 2676 840
1950 6177 6457
4091 94 5102
1907 6050 3455
714 3 559
502 4268 4164
1019 5558 271
6127 854 3221
959 5337 2735

TABLE 9d

Address of Parity Bit Accumulators (Rate 32/45) ($n_{ldpc} = 16200$)

2686 655 2308 1603 336 1743 2778 1263 3555 185 4212 621
286 2994 2599 2265 126 314 3992 4560 2845 2764 2540 1476
2670 3599 2900 2281 3597 2768 4423 2805 836 130 1204 4162
1884 4228 1253 2578 3053 3650 2587 4468 2784 1644 1490 4655
4258 1699 4363 4555 3810 4046 3806 344 2459 4067 3327 3510
1021 2741 2528 2168 2820
254 1080 616
1465 4192 2972
2356 2976 1534
4412 1937 2724
1430 3024 600
1952 2136 3573
3009 3123 1288
4553 2299 806
2997 402 4330
3302 4567 698
2364 498 3146
1809 647 992
3512 32 4301
1238 251 450
1657 737 641
560 1720 2893
1689 2206 902
3998 1784 2094
2090 3126 1201
1565 764 3473
891 903 2413
2286 2900 2348
3026 2033 1502
2404 1243 556
308 2222 3825
1523 3311 389

TABLE 9e

Address of Parity Bit Accumulators (Rate 3/5) ($n_{ldpc} = 16200$)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195

TABLE 9e-continued

Address of Parity Bit Accumulators (Rate 3/5) ($n_{ldpc}$ = 16200)

2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 9f

Address of Parity Bit Accumulators (Rate 2/3) ($n_{ldpc}$ = 16200)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

Figure 5:
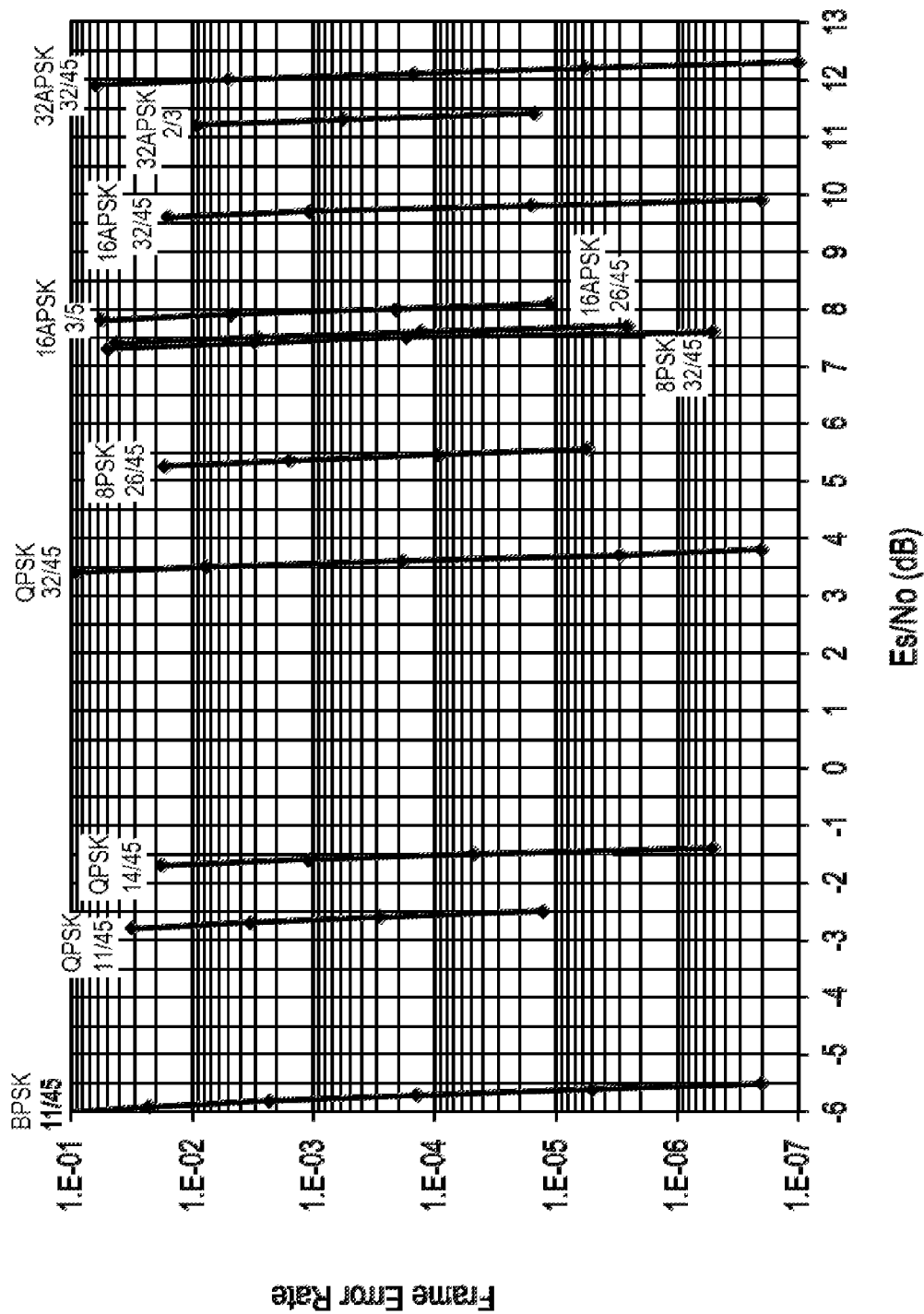
FIG. 5 illustrates simulated performance curves for the provided modulation and coding schemes over an AWGN channel, in accordance with exemplary embodiments of the present invention.

FIG. 5 illustrates simulated performance curves for the provided modulation and coding schemes (listed above in Table 5) over an AWGN channel, in accordance with exemplary embodiments of the present invention.

Figure 6:
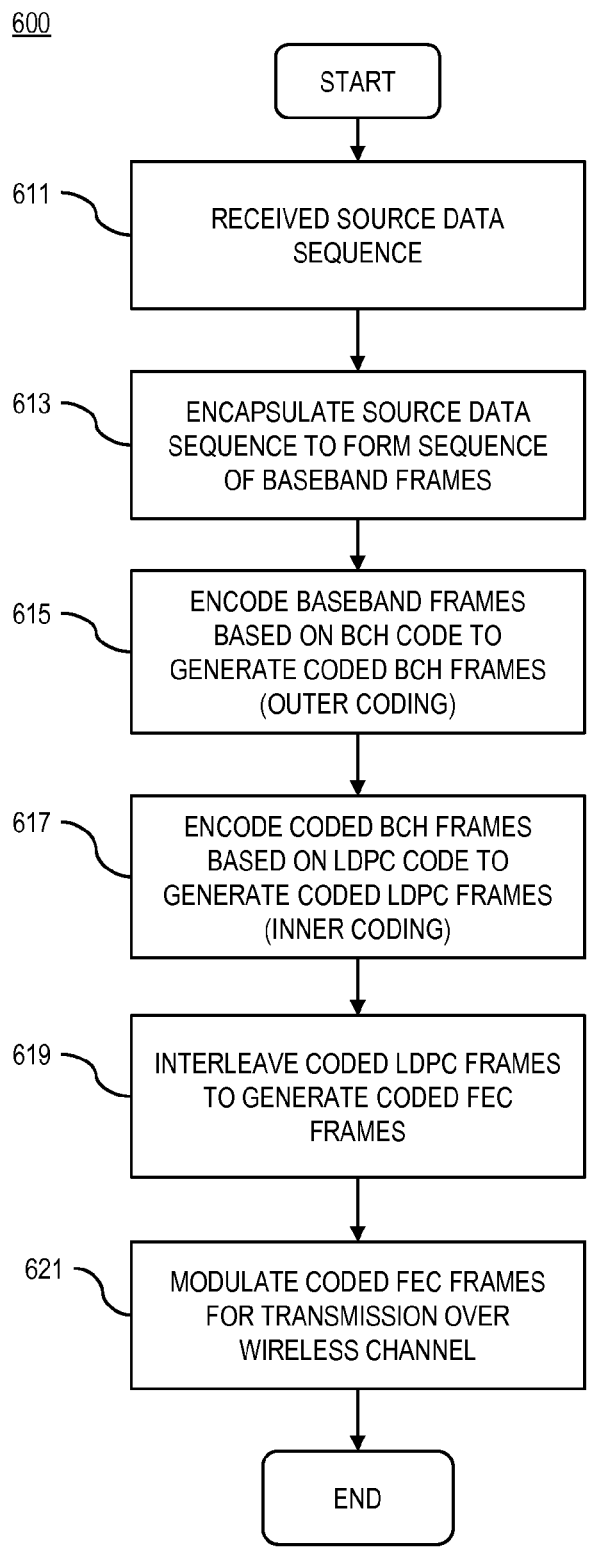
FIG. 6 illustrates a flow chart of an exemplary process for encoding and modulating a source data sequence of information bits, in accordance with exemplary embodiments of the present invention.

FIG. 6 illustrates a flow chart of the encoding and modulation processes described above, in accordance with exemplary embodiments of the present invention. For example, the encoding and modulation process 600 may be performed by a transmitter 210 as depicted in FIG. 2A. With reference to FIG. 6, the process starts at step 611, where a source data sequence is received, for example, by the data encapsulation module 211. At step 613, the encapsulation module encapsulates the source data sequence to form a sequence of baseband frames. At step 615, the BCH encoder 213a encodes the baseband frames in accordance with a t-error BCH code to generate respective coded BCH data frames. At step 617, the LDPC encoder 213b encodes the coded BCH data frames in accordance with a structured LDPC code to generate coded LDPC data frames. At step 619, the bit interleaver 213c interleaves the coded bits of the coded LDPC data frames to generate coded FEC frames. At step 621 the modulator 215 modulates the coded FEC frames in accordance with a selected modulation scheme for transmission over the wireless satellite channel 114.

Figure 7:
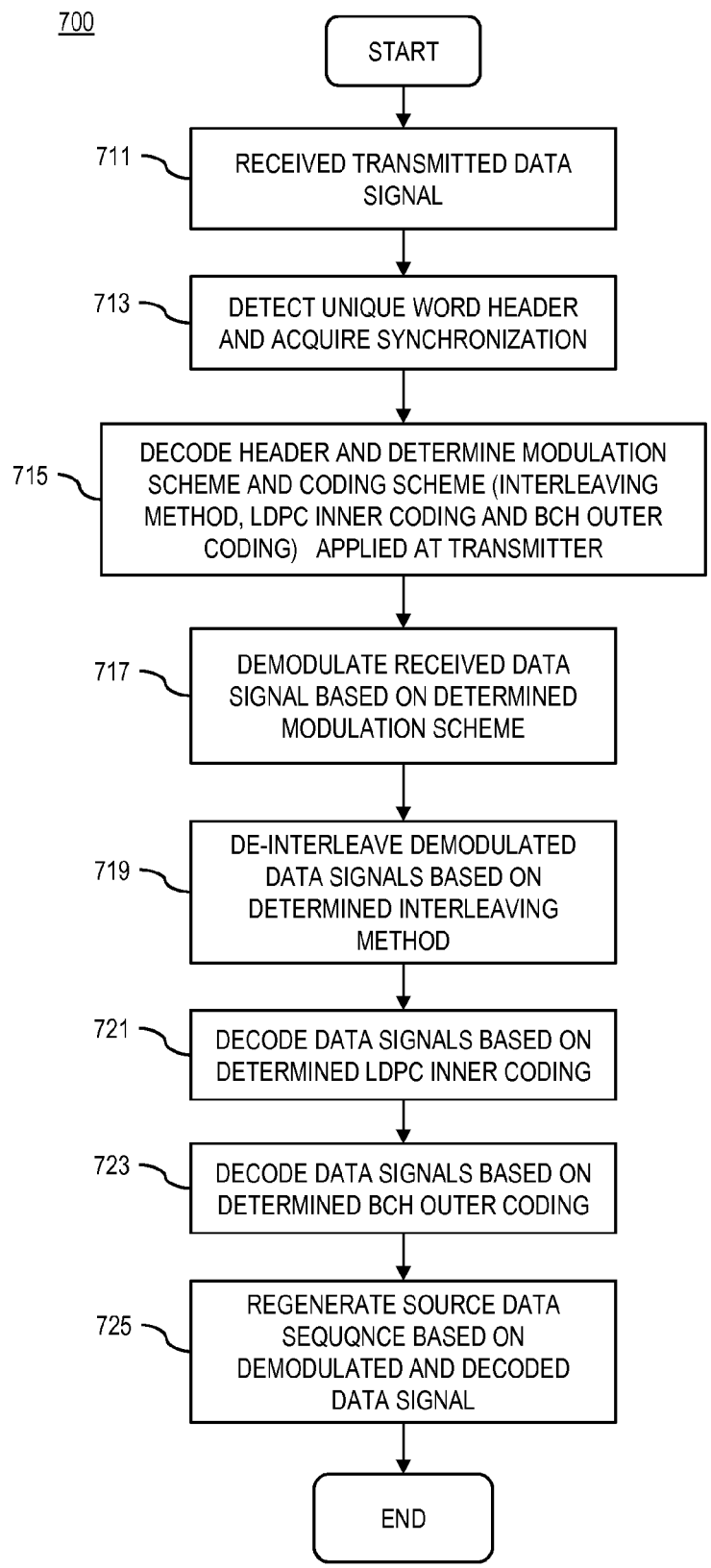
FIG. 7 illustrates a flow chart of an exemplary process for demodulating and decoding a received data signal transmission to replicate a source data sequence of information bits that was encoded and modulated, in accordance with exemplary embodiments of the present invention.

FIG. 7 illustrates a flow chart of an exemplary process for demodulating and decoding a received data signal transmission to replicate a source data sequence of information bits that was encoded and modulated as described above, in accordance with exemplary embodiments of the present invention. For example, the decoding and demodulation process 700 may be performed by a receiver 220 as depicted in FIG. 2B. With reference to FIG. 7, the process starts at step 711, where the data signals transmitted over the satellite channel 114 are received by the receiver 220. At step 713, the sync module 227 detects the unique word and acquires synchronization. At step 715, the receiver decodes header information to determine the modulation scheme and coding scheme (e.g., the interleaving method, LDPC inner coding and BCH outer coding applied at the transmitter. The decoding of the header information, for example, may be performed by the sync module 227 or the decoder module 223 (or by another module of the receiver configured to perform such header decoding not shown in FIG. 2B). At step 717, the demodulator 225 demodulates the received data signals based on the determined modulation scheme to generate a received replica of the transmitted FEC frames. At step 719, the decoder 223 de-interleaves the demodulated data frames based on the determined interleaving method. At step 721, the decoder 723 decodes the de-interleaved data based on the determined LDPC inner coding. At step 723, the decoder 223 further decodes the data frames based on the determined BCH outer coding. Then at step 725, the data de-encapsulation module de-encapsulates the decoded data frames to generate a replica of the original source data sequence.

FIG. 8 illustrates a block diagram of a chip set that can be utilized in implementing communications system protocols, according to exemplary embodiments of the present invention. With reference to FIG. 8, chip set 800 includes, for instance, processor and memory components described with respect to FIG. 5 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 800 includes a communication mechanism such as a bus 801 for passing information among the components of the chip set. A processor 803 has connectivity to the bus 801 to execute instructions and process information stored in, for example, a memory 805. The processor 803 includes one or more processing cores with each core configured to perform independently. A multi-core processor enables multiprocessing within a single physical package. Examples of a multi-core processor include two, four, eight, or greater numbers of processing cores. Alternatively or in addition, the processor 503 includes one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, and/or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 may comprise various forms of computer-readable media, e.g., including both dynamic memory (e.g., RAM) and static memory (e.g., ROM) for storing executable instructions that, when executed by the processor 803 and/or the DSP 807 and/or the ASIC 809, perform the process of exemplary embodiments as described herein. The memory 805 also stores the data associated with or generated by the execution of the process.

The term "computer-readable medium" or "computer-readable media," as used herein, refers to any medium that participates in providing instructions for execution by the processor 803, and/or one or more of the specialized components, such as the one or more digital signal processors (DSP) 807, and/or one or more application-specific integrated circuits (ASIC) 809. Such a medium may take many forms, including but not limited to non-volatile media, volatile media, and transmission media. Non-volatile media include, for example, read only memory (ROM), included within memory 805. Volatile media, for example, may include dynamic random access memory (RAM), included within memory 805. Transmission media may include copper or other conductive wiring, fiber optics, or other physical transmission media, including the wires and/or optical fiber that comprise bus 801. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semiconductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various exemplary embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

While exemplary embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
encoding, by an encoder of a wireless communications terminal, a sequence of information bits of a source data signal based on a predetermined structured parity check matrix of a Low Density Parity Check (LDPC) code, wherein the encoding is performed based on frames of the sequence of information bits, each frame being of a length of $k_{ldpc}$ information bits ($i_0, i_1 \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 1a through 1d (below);

wherein the encoding comprises generating $n_{ldpc}-k_{ldpc}$ parity bits ($p_0, p_1, \ldots, p_{n_{ldpc}-k_{ldpc}-1}$) for each frame of the sequence of information bits, wherein the generation of the parity bits comprises:

initializing parity bit accumulators for $p_0, p_1, \ldots, p_{n_{ldpc}-k_{ldpc}-1}$ to zero;

accumulating information bit $i_0$ at parity bit accumulator addresses specified in the first row of the table;

for the next group of m−1 information bits, $i_y$, (y=1, 2, ..., m−1), accumulating each information bit at parity bit accumulator addresses $\{x+(y \bmod m)*q\} \bmod (n_{ldpc}-k_{ldpc})$, wherein x denotes an address of a parity bit accumulator corresponding to the information bit $i_0$, and q is a code-rate dependent constant ($q=(n_{ldpc}-k)/m$), and wherein m is a code-dependent constant and k=R*n (where R is the code rate);

accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, ..., 2m) at $\{x+(z \bmod m)*q\} \bmod (n_{ldpc}-k_{ldpc})$, wherein x denotes the address of the parity bit accumulator corresponding to the information bit $i_m$ (the entries of the second row of the table);

in a similar manner, for each subsequent group of m information bits, accumulating the information bits at parity bit addresses based on a next row of the table; and after all of the information bits of the frame are accumulated, performing operations according to $p_i = p_i \oplus p_{i-1}$, wherein for i=1, 2, ..., ($n_{ldpc}-k_{ldpc}-1$), each $p_i$ resulting from the operation for a given i is equal to the parity bit $p_i$;

TABLE 1a

Address of Parity Bit Accumulators (Rate 11/45) ($n_{ldpc}$ = 16200)

9054 9186 12155 1000 7383 6459 2992 4723 8135 11250
2624 9237 7139 12238 11962 4361 5292 10967 11036 8105
2044 11996 5654 7568 7002 3549 4767 8767 2872 8345
6966 8473 5180 8084 3359 5051 9576 5139 1893 902
3041 3801 8252 11951 909 8535 1038 8400 3200 4585
5291 10484 10872
442 7516 3720
11469 769 10998
10575 1436 2935
6905 8610 11285
1873 5634 6383

TABLE 1b

Address of Parity Bit Accumulators (Rate 14/45) ($n_{ldpc}$ = 16200)

1606 3617 7973 6737 9495 4209 9209 4565 4250 7823 9384 400
4105 991 923 3562 3892 10993 5640 8196 6652 4653 9116 7677
6348 1341 5445 1494 7799 831 4952 5106 3011 9921 6537 8476
7854 5274 8572 3741 5674 11128 4097 1398 5671 7302 8155 2641
6548 2103 590 5749 5722 10 2682 1063 633 2949 207 6065
2828 6366 4766 399 935 7611 84 150 3146
5363 7455 7140
9297 482 4848
8458 1631 5344
5729 6767 4836
11019 4463 3882
4107 9610 5454
11137 4328 6307
3260 7897 3809

TABLE 1c

Address of Parity Bit Accumulators (Rate 26/45) ($n_{ldpc}$ = 16200)

6106 5389 698 6749 6294 1653 1984 2167 6139 6095 3832 2468 6115
4202 2362 1852 1264 3564 6345 498 6137 3908 3302 527 2767 6667

TABLE 1c-continued

Address of Parity Bit Accumulators (Rate 26/45) ($n_{ldpc}$ = 16200)

3422 1242 1377 2238 2899 1974 1957 261 3463 4994 215 2338
3016 5109 6533 2665 5300 4908 4967 5787 726 229 1970 2789
6146 5765 6649 2871 884 1670 2597 5058 3659 6594 5042 304
5521 2811 0 4214 2626 2211 1236 3771 852 6356 6797 3463
1523 1830 3938 5593 2128 5791 3421 3680 6692 1377 3808 3475
5551 6035 2247 3662 759 6783 116 6380 4586 3367 1 5003
3518 6557 6510
1830 839 4421
5431 5959 6152
3174 5113 4520
5399 1303 2496
2841 741 220
2731 1830 4193
1875 3935 223
9 4720 423
3107 2676 840
1950 6177 6457
4091 94 5102
1907 6050 3455
714 3 559
502 4268 4164
1019 5558 271
6127 854 3221
959 5337 2735

TABLE 1d

Address of Parity Bit Accumulators (Rate 32/45) ($n_{ldpc}$ = 16200)

2686 655 2308 1603 336 1743 2778 1263 3555 185 4212 621
286 2994 2599 2265 126 314 3992 4560 2845 2764 2540 1476
2670 3599 2900 2281 3597 2768 4423 2805 836 130 1204 4162
1884 4228 1253 2578 3053 3650 2587 4468 2784 1644 1490 4655
4258 1699 4363 4555 3810 4046 3806 344 2459 4067 3327 3510
1021 2741 2528 2168 2820
254 1080 616
1465 4192 2972
2356 2976 1534
4412 1937 2724
1430 3024 600
1952 2136 3573
3009 3123 1288
4553 2299 806
2997 402 4330
3302 4567 698
2364 498 3146
1809 647 992
3512 32 4301
1238 251 450
1657 737 641
560 1720 2893
1689 2206 902
3998 1784 2094
2090 3126 1201
1565 764 3473
891 903 2413
2286 2900 2348
3026 2033 1502
2404 1243 556
308 2222 3825
1523 3311 389;

and wherein the encoding processes the source data signal for transmission over a wireless communications channel.

2. The method of claim 1, wherein the LDPC code is of a structure that facilitates use of a plurality of parallel engines for decoding the coded signal.

3. The method of claim 1, wherein $n_{ldpc}$=16200, and m=360.

4. The method of claim 1, further comprising:

modulating, by a modulator of the wireless communications terminal, the coded LDPC frames according to according to one of the following modulation types: π/2 BPSK (Binary Phase Shift Keying), QPSK (Quadrature Phase Shift Keying), 8-PSK (Phase Shift Keying), 16-APSK (Amplitude Phase Shift Keying), and 32-APSK.

5. The method of claim 1, wherein the sequence of information bits of the source data signal is segmented into a series of baseband frames, and the method further comprises:
encoding each baseband frame based on a t-error Bose Chaudhuri Hocquenghem (BCH) code, wherein the BCH encoding comprises an outer coding and the LDPC encoding comprises an inner coding.

6. The method of claim 5, further comprising:
interleaving, by an interleaver of the wireless communications terminal, each coded LDPC frame using a block interleaver, wherein the coded bits are written into an interleaver array on a column-by-column basis and read out on a row-by-row basis, and the output of the interleaving comprises coded FEC frames.

7. The method of claim 6, wherein the interleaver array comprises a number of rows and a number of columns, and the coded bits are read out of each row in a predetermined order, and wherein:
the number of columns in the interleaver array is based on a selected modulation scheme as specified in the following table:

| Modulation Scheme | # of Interleaver Array Columns |
| --- | --- |
| 8 PSK | 3 |
| 16 APSK | 4 |
| 32 APSK | 5; | and
the order in which the coded bits are read out of each row of the interleaver array is based on the selected modulation scheme and a selected code rate as specified in the following table (where the numbers reflecting the bit interleaver patterns chronologically signify a respective column of the row being read out, with "0" signifying the leftmost column):

| Modulation | Code Rate | Bit Interleaver Pattern |
| --- | --- | --- |
| 8 PSK | 26/45 | 1-0-2 |
| 16 APSK | 26/45 | 2-1-3-0 |
| 8 PSK | 32/45 | 0-1-2 |
| 16 APSK | 32/45 | 0-1-2-3 |
| 32 APSK | 32/45 | 1-0-4-2-3. |

8. The method of claim 7, further comprising:
modulating the coded FEC frames according to the selected modulation scheme, wherein the selected modulation scheme comprises one of the following modulation types: π/2 BPSK (Binary Phase Shift Keying), QPSK (Quadrature Phase Shift Keying), 8-PSK (Phase Shift Keying), 16-APSK (Amplitude Phase Shift Keying), and 32-APSK;
wherein, in the case of π/2 BPSK or QPSK, the coded FEC frames are not interleaved.

9. A method comprising:
encoding, by an encoder of a wireless communications terminal, a sequence of information bits of a source data signal based on a predetermined structured parity check matrix of a Low Density Parity Check (LDPC) code, wherein the encoding is performed based on frames of the sequence of information bits, each frame being of a length of $k_{ldpc}$ information bits $(i_0, i_1, \ldots, i_{k_{ldpc}-1})$, and the output of the encoding comprises coded LDPC frames each being $n_{ldpc}$ coded bits in length, and
wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 9a through 9b (below);
wherein the encoding comprises generating $n_{ldpc}-k_{ldpc}$ parity bits $(p_0, p_1, \ldots, p_{n_{ldpc}-k_{ldpc}-1})$ for each frame of the sequence of information bits, wherein the generation of the parity bits comprises:
initializing parity bit accumulators for $p_0, p_1, \ldots, p_{n_{ldpc}-k_{ldpc}-1}$ to zero;
accumulating information bit $i_0$ at parity bit accumulator addresses specified in the first row of the table;
for the next group of m−1 information bits, $i_y$ (y=1, 2, ..., m−1), accumulating each information bit at parity bit accumulator addresses $\{x+(y \bmod m)*q\} \bmod (n_{ldpc}-k_{ldpc})$, wherein x denotes an address of a parity bit accumulator corresponding to the information bit $i_0$, and q is a code-rate dependent constant $(q=(n_{ldpc}-k)/m)$, and wherein m is a code dependent constant and k=R*n (where R is the code rate);
accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, ..., 2m) at $\{x+(z \bmod m)*q\} \bmod (n_{ldpc}-k_{ldpc})$, wherein x denotes the address of the parity bit accumulator corresponding to the information bit $i_m$ (the entries of the second row of the table);
in a similar manner, for each subsequent group of m information bits, accumulating the information bits at parity bit addresses based on a next row of the table; and
after all of the information bits of the frame are accumulated, performing operations according to $p_i = p_i \oplus p_{i-1}$, wherein for i=1, 2, ..., $(n_{ldpc}-k_{ldpc}-1)$, each $p_i$ resulting from the operation for a given i is equal to the parity bit $p_i$;
wherein $n_{ldpc}$=16200, and m=360;

TABLE 9a

Address of Parity Bit Accumulators (Rate 3/5) ($n_{ldpc}$ = 16200)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956

TABLE 9a-continued

Address of Parity Bit Accumulators (Rate 3/5) ($n_{ldpc}$ = 16200)

8 5692 3417
9 266 4878
10 4913 3247
11 4763 3937
12 3590 2903
13 2566 4215
14 5208 4707
15 3940 3388
16 5109 4556
17 4908 4177

TABLE 9b

Address of Parity Bit Accumulators (Rate 2/3) ($n_{ldpc}$ = 16200)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894;

and
interleaving, by an interleaver of the wireless communications terminal, each coded LDPC frame using a block interleaver, wherein the coded bits are written into an interleaver array on a column-by-column basis and read out on a row-by-row basis, and the output of the interleaving comprises coded FEC frames, wherein the interleaver array comprises a number of rows and a number of columns, and the coded bits are read out of each row in a predetermined order, and wherein the number of columns in the interleaver array is based on a selected modulation scheme as specified in the following table:

| Modulation Scheme | # of Interleaver Array Columns |
|---|---|
| 16 APSK | 4 |
| 32 APSK | 5; | and
the order in which the coded bits are read out of each row of the interleaver array is based on the selected modulation scheme and a selected code rate as specified in the following table (where the numbers reflecting the bit interleaver patterns chronologically signify a respective column of the row being read out, with "0" signifying the leftmost column):

| Modulation | Code Rate | Bit Interleaver Pattern |
|---|---|---|
| 16 APSK | 3/5 | 3-2-0-1 |
| 32 APSK | 2/3 | 4-1-3-2-0; | and
wherein the encoding and interleaving process the source data signal for transmission over a wireless communications channel.

10. The method of claim 9, wherein the sequence of information bits of the source data signal is segmented into a series of baseband frames, and the method further comprises:
encoding each baseband frame based on a t-error Bose Chaudhuri Hocquenghem (BCH) code, wherein the BCH encoding comprises an outer coding and the LDPC encoding comprises an inner coding.

11. The method of claim 9, further comprising:
modulating, by a modulator of the wireless communications terminal, the coded FEC frames according to the respective modulation scheme.

12. A wireless communications terminal apparatus, comprising:
an encoder configured to encode a sequence of information bits of a source data signal on a predetermined structured parity check matrix of a Low Density Parity Check (LDPC) code, wherein the encoding is performed based on frames of the source data sequence of information bits, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and
wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 12a through 12d (below);
wherein the encoding comprises generating $n_{ldpc}-k_{ldpc}$ parity bits ($p_0, p_1, \ldots, p_{n_{ldpc}-k_{ldpc}-1}$) for each frame of the sequence of information bits, wherein the generation of the parity bits comprises:
initializing parity bit accumulators for $p_0, p_1, \ldots, p_{n_{ldpc}-k_{ldpc}-1}$ to zero;
accumulating information bit $i_0$ at parity bit accumulator addresses specified in the first row of the table;
for the next group of m−1 information bits, $i_y$ (y=1, 2, ..., m−1), accumulating each information bit at parity bit accumulator addresses {x+(y mod m)*q} mod ($n_{ldpc}-k_{ldpc}$), wherein x denotes an address of a parity bit accumulator corresponding to the information bit $i_0$, and q is a code-rate dependent constant (q=($n_{ldpc}$−k)/m), and wherein m is a code-dependent constant and k=R*n (where R is the code rate);
accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, ..., 2m) at {x+(z mod m)*q} mod ($n_{ldpc}-k_{ldpc}$), wherein x denotes the address of the parity bit accumulator corresponding to the information bit $i_m$ (the entries of the second row of the table);

in a similar manner, for each subsequent group of m information bits, accumulating the information bits at parity bit addresses based on a next row of the table; and after all of the information bits of the frame are accumulated, performing operations according to $p_i = p_i \oplus p_{i-1}$, wherein for $i=1, 2, \ldots, (n_{ldpc}-k_{ldpc}-1)$, each $p_i$ resulting from the operation for a given i is equal to the parity bit $p_i$;

TABLE 12a

Address of Parity Bit Accumulators (Rate 11/45) ($n_{ldpc}$ = 16200)

9054 9186 12155 1000 7383 6459 2992 4723 8135 11250
2624 9237 7139 12238 11962 4361 5292 10967 11036 8105
2044 11996 5654 7568 7002 3549 4767 8767 2872 8345
6966 8473 5180 8084 3359 5051 9576 5139 1893 902
3041 3801 8252 11951 909 8535 1038 8400 3200 4585
5291 10484 10872
442 7516 3720
11469 769 10998
10575 1436 2935
6905 8610 11285
1873 5634 6383

TABLE 12b

Address of Parity Bit Accumulators (Rate 14/45) ($n_{ldpc}$ = 16200)

1606 3617 7973 6737 9495 4209 9209 4565 4250 7823 9384 400
4105 991 923 3562 3892 10993 5640 8196 6652 4653 9116 7677
6348 1341 5445 1494 7799 831 4952 5106 3011 9921 6537 8476
7854 5274 8572 3741 5674 11128 4097 1398 5671 7302 8155 2641
6548 2103 590 5749 5722 10 2682 1063 633 2949 207 6065
2828 6366 4766 399 935 7611 84 150 3146
5363 7455 7140
9297 482 4848
8458 1631 5344
5729 6767 4836
11019 4463 3882
4107 9610 5454
11137 4328 6307
3260 7897 3809

TABLE 12c

Address of Parity Bit Accumulators (Rate 26/45) ($n_{ldpc}$ = 16200)

6106 5389 698 6749 6294 1653 1984 2167 6139 6095 3832 2468 6115
4202 2362 1852 1264 3564 6345 498 6137 3908 3302 527 2767 6667
3422 1242 1377 2238 2899 1974 1957 261 3463 4994 215 2338
3016 5109 6533 2665 5300 4908 4967 5787 726 229 1970 2789
6146 5765 6649 2871 884 1670 2597 5058 3659 6594 5042 304
5521 2811 0 4214 2626 2211 1236 3771 852 6356 6797 3463
1523 1830 3938 5593 2128 5791 3421 3680 6692 1377 3808 3475
5551 6035 2247 3662 759 6783 116 6380 4586 3367 1 5003
3518 6557 6510
1830 839 4421
5431 5959 6152
3174 5113 4520
5399 1303 2496
2841 741 220
2731 1830 4193
1875 3935 223
9 4720 423
3107 2676 840
1950 6177 6457
4091 94 5102
1907 6050 3455
714 3 559

TABLE 12c-continued

Address of Parity Bit Accumulators (Rate 26/45) ($n_{ldpc}$ = 16200)

502 4268 4164
1019 5558 271
6127 854 3221
959 5337 2735

TABLE 12d

Address of Parity Bit Accumulators (Rate 32/45) ($n_{ldpc}$ = 16200)

2686 655 2308 1603 336 1743 2778 1263 3555 185 4212 621
286 2994 2599 2265 126 314 3992 4560 2845 2764 2540 1476
2670 3599 2900 2281 3597 2768 4423 2805 836 130 1204 4162
1884 4228 1253 2578 3053 3650 2587 4468 2784 1644 1490 4655
4258 1699 4363 4555 3810 4046 3806 344 2459 4067 3327 3510
1021 2741 2528 2168 2820
254 1080 616
1465 4192 2972
2356 2976 1534
4412 1937 2724
1430 3024 600
1952 2136 3573
3009 3123 1288
4553 2299 806
2997 402 4330
3302 4567 698
2364 498 3146
1809 647 992
3512 32 4301
1238 251 450
1657 737 641
560 1720 2893
1689 2206 902
3998 1784 2094
2090 3126 1201
1565 764 3473
891 903 2413
2286 2900 2348
3026 2033 1502
2404 1243 556
308 2222 3825
1523 3311 389;

and
wherein the encoding processes the source data signal for transmission over a wireless communications channel.

13. The apparatus of claim 12, wherein the LDPC code is of a structure that facilitates use of a plurality of parallel engines for decoding the coded signal.

14. The apparatus of claim 12, wherein $n_{ldpc}$=16200, and m=360.

15. The apparatus of claim 12, further comprising:
a modulator configured to modulate the coded LDPC frames according to according to one of the following modulation types: π/2 BPSK (Binary Phase Shift Keying), QPSK (Quadrature Phase Shift Keying), 8-PSK (Phase Shift Keying), 16-APSK (Amplitude Phase Shift Keying), and 32-APSK.

16. The apparatus of claim 12, wherein the sequence of information bits of the source data signal is segmented into a series of baseband frames, and wherein the encoder is further configured to encode each baseband frame based on a t-error Bose Chaudhuri Hocquenghem (BCH) code, wherein the BCH encoding comprises an outer coding and the LDPC encoding comprises an inner coding.

17. The apparatus of claim 16, further comprising:
an interleaver configured to interleave each coded LDPC frame, wherein the coded bits are written into an interleaver array on a column-by-column basis and read out on a row-by-row basis, and the output of the interleaving comprises coded FEC frames.

18. The apparatus of claim 17, wherein the interleaver array comprises a number of rows and a number of columns, and the coded bits are read out of each row in a predetermined order, and wherein:

the number of columns in the interleaver array is based on a selected modulation scheme as specified in the following table:

| Modulation Scheme | # of Interleaver Array Columns |
|---|---|
| 8 PSK | 3 |
| 16 APSK | 4 |
| 32 APSK | 5; | and the order in which the coded bits are read out of each row of the interleaver array is based on the selected modulation scheme and a selected code rate as specified in the following table (where the numbers reflecting the bit interleaver patterns chronologically signify a respective column of the row being read out, with "0" signifying the leftmost column):

| Modulation | Code Rate | Bit Interleaver Pattern |
|---|---|---|
| 8 PSK | 26/45 | 1-0-2 |
| 16 APSK | 26/45 | 2-1-3-0 |
| 8 PSK | 32/45 | 0-1-2 |
| 16 APSK | 32/45 | 0-1-2-3 |
| 32 APSK | 32/45 | 1-0-4-2-3. |

19. The apparatus of claim 18, wherein the modulator is further configured to modulate the coded FEC frames according to the selected modulation scheme, wherein the selected modulation scheme comprises one of the following modulation types: π/2 BPSK (Binary Phase Shift Keying), QPSK (Quadrature Phase Shift Keying), 8-PSK (Phase Shift Keying), 16-APSK (Amplitude Phase Shift Keying), and 32-APSK; and wherein, in the case of π/2 BPSK or QPSK, the coded FEC frames are not interleaved.

20. A wireless communications terminal apparatus, comprising:

an encoder configured to encode a sequence of information bits of a source data signal based on a predetermined structured parity check matrix of a Low Density Parity Check (LDPC) code, wherein the encoding is performed based on frames of the sequence of information bits, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 20a through 20b (below);

wherein the encoding comprises generating $n_{ldpc}-k_{ldpc}$ parity bits ($p_0, p_1, \ldots, p_{n_{ldpc}-k_{ldpc}-1}$) for each frame of the sequence of information bits, wherein the generation of the parity bits comprises:

initializing parity bit accumulators for $p_0, p_1, \ldots, p_{n_{ldpc}-k_{ldpc}-1}$ to zero;

accumulating information bit $i_0$ at parity bit accumulator addresses specified in the first row of the table;

for the next group of m−1 information bits, $i_y$, (y=1, 2, ..., m−1), accumulating each information bit at parity bit accumulator addresses {x+(y mod m)*q} mod ($n_{ldpc}-k_{ldpc}$), wherein x denotes an address of a parity bit accumulator corresponding to the information bit $i_0$, and q is a code-rate dependent constant (q=($n_{ldpc}-k$)/m), and wherein m is a code-dependent constant and k=R*n (where R is the code rate);

accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, ..., 2m) at {x+(z mod m)*q} mod ($n_{ldpc}-k_{ldpc}$), wherein x denotes the address of the parity bit accumulator corresponding to the information bit $i_m$ (the entries of the second row of the table);

in a similar manner, for each subsequent group of m information bits, accumulating the information bits at parity bit addresses based on a next row of the table; and after all of the information bits of the frame are accumulated, performing operations according to $p_i = p_i \oplus p_{i-1}$, wherein for i=1, 2, ..., ($n_{ldpc}-k_{ldpc}-1$), each $p_i$ resulting from the operation for a given i is equal to the parity bit $p_i$;

wherein $n_{ldpc}$=16200, and m=360;

TABLE 20a

Address of Parity Bit Accumulators (Rate 3/5) ($n_{ldpc}$ = 16200)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 20b

Address of Parity Bit Accumulators (Rate 2/3) ($n_{ldpc}$ = 16200)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836

TABLE 20b-continued

Address of Parity Bit Accumulators (Rate 2/3) ($n_{ldpc}$ = 16200)

6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894;

and
    wherein the apparatus further comprises an interleave configured to interleave each coded LDPC frame using a block interleaver, wherein the coded bits are written into an interleaver array on a column-by-column basis and read out on a row-by-row basis, and the output of the interleaving comprises coded FEC frames, wherein the interleaver array comprises a number of rows and a number of columns, and the coded bits are read out of each row in a predetermined order, wherein the number of columns in the interleaver array is based on a selected modulation scheme as specified in the following table:

| Modulation Scheme | # of Interleaver Array Columns |
|---|---|
| 16 APSK | 4 |
| 32 APSK | 5; | and
    wherein the order in which the coded bits are read out of each row of the interleaver array is based on the selected modulation scheme and a selected code rate as specified in the following table (where the numbers reflecting the bit interleaver patterns chronologically signify a respective column of the row being read out, with "0" signifying the leftmost column):

| Modulation | Code Rate | Bit Interleaver Pattern |
|---|---|---|
| 16 APSK | 3/5 | 3-2-0-1 |
| 32 APSK | 2/3 | 4-1-3-2-0; | and
    wherein the encoding and interleaving process the source data signal for transmission over a wireless communications channel.

21. The apparatus of claim 20, wherein the sequence of information bits of the source data signal is segmented into a series of baseband frames, and wherein the encoder is further configured to encode each baseband frame based on a t-error Bose Chaudhuri Hocquenghem (BCH) code, wherein the BCH encoding comprises an outer coding and the LDPC encoding comprises an inner coding.

22. The apparatus of claim 20, further comprising:
    a modulator configured to modulate the coded FEC frames according to the respective modulation scheme.

* * * * *